US 011340674B2

(12) United States Patent
Gao et al.

(10) Patent No.: US 11,340,674 B2
(45) Date of Patent: May 24, 2022

(54) POWER SUPPLY APPARATUS AND COMMUNICATION APPARATUS

(71) Applicant: FUJITSU LIMITED, Kawasaki (JP)

(72) Inventors: Hong Gao, Inagi (JP); Hiroyuki Nakamoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 190 days.

(21) Appl. No.: 16/192,118

(22) Filed: Nov. 15, 2018

(65) Prior Publication Data

US 2019/0171266 A1  Jun. 6, 2019

(30) Foreign Application Priority Data

Dec. 5, 2017  (JP) .............................. JP2017-233688

(51) Int. Cl.
  *G06F 1/26*    (2006.01)
  *H02J 7/35*    (2006.01)
  (Continued)

(52) U.S. Cl.
  CPC ............ *G06F 1/263* (2013.01); *H01L 31/042* (2013.01); *H02J 7/0068* (2013.01); *H02J 7/345* (2013.01); *H02J 7/35* (2013.01)

(58) Field of Classification Search
  CPC .... G06F 1/26; G06F 1/263; H02J 7/35; H02J 7/0068; H02J 7/00; H02J 7/345; H01L 31/042
  (Continued)

(56) References Cited

U.S. PATENT DOCUMENTS 5,986,354 A * 11/1999 Nagao ................... H02J 7/345
                                                    307/64
8,217,619 B2 * 7/2012 Sander ................... H02J 7/35
                                                    320/101
(Continued)

FOREIGN PATENT DOCUMENTS

JP  63-007388 U   1/1988
JP  07-250437    9/1995
(Continued)

OTHER PUBLICATIONS

JPOA—Japanese Office Action dated Aug. 31, 2021 for corresponding Japanese Patent Application No. 2017-233688, with English translation.

*Primary Examiner* — Richard Isla
*Assistant Examiner* — Dung V Bui
(74) *Attorney, Agent, or Firm* — Fujitsu Patent Center

(57) ABSTRACT

A power supply apparatus includes, a power generating circuit that converts energy to power and output a voltage of the power, a first switch installed on either or both of a pair of power lines, a first switch control circuit that controls the first switch based on the level of the voltage, a second switch installed on a branched line coupled to the pair of power lines, a second switch control circuit that controls the second switch based on the level of the voltage, and controls the second switch so that the second switch is repeatedly turned on and off when a power storage circuit is charged with power generated by the power generating circuit, and the power storage circuit installed on the branched line and coupled to the power generating circuit when the first switch and the second switch are set to ON states.

13 Claims, 14 Drawing Sheets

(51) Int. Cl.
*H01L 31/042* (2014.01)
*H02J 7/00* (2006.01)
*H02J 7/34* (2006.01)

(58) Field of Classification Search
USPC .......................................................... 320/134
See application file for complete search history.

(56) References Cited

U.S. PATENT DOCUMENTS

| | | | | |
|---|---|---|---|---|
| 2003/0169014 A1* | 9/2003 | Kadah | ................ | H02M 1/4208 318/727 |
| 2005/0093514 A1* | 5/2005 | Shimizu | ................ | H02J 7/0019 320/116 |
| 2006/0012336 A1* | 1/2006 | Fujita | .................... | H02J 7/0013 320/119 |
| 2008/0306700 A1* | 12/2008 | Kawam | ............. | H01L 31/02021 702/64 |
| 2011/0140647 A1* | 6/2011 | Park | ..................... | G06F 1/3625 320/101 |
| 2011/0264293 A1* | 10/2011 | Forrest | ..................... | H02J 7/35 700/295 |
| 2012/0153726 A1* | 6/2012 | Moon | ..................... | H02J 3/32 307/46 |
| 2013/0049673 A1* | 2/2013 | Agarwal | ................ | H02J 7/0016 320/101 |
| 2013/0257383 A1* | 10/2013 | Shim | ..................... | H02J 7/0048 320/134 |
| 2014/0176043 A1* | 6/2014 | Fujiyama | ................. | H02J 7/00 320/101 |
| 2016/0226381 A1* | 8/2016 | Gao | ..................... | H02M 3/1563 |
| 2016/0345081 A1* | 11/2016 | Yamada | ................. | H04Q 9/00 |
| 2017/0005499 A1* | 1/2017 | Zhang | ................. | H02J 7/0068 |
| 2017/0125146 A1* | 5/2017 | Shiki | ..................... | E02F 9/2095 |
| 2017/0294691 A1* | 10/2017 | Yamamoto | .......... | H02J 7/00038 |

FOREIGN PATENT DOCUMENTS

| | | |
|---|---|---|
| JP | 2015-171265 | 9/2015 |
| JP | 2017-18430 | 1/2017 |

* cited by examiner

POWER SUPPLY APPARATUS AND COMMUNICATION APPARATUS

CROSS-REFERENCE TO RELATED APPLICATION

This application is based upon and claims the benefit of priority of the prior Japanese Patent Application No. 2017-233688, filed on Dec. 5, 2017, the entire contents of which are incorporated herein by reference.

FIELD

The embodiments discussed herein are related to a power supply apparatus and a communication apparatus.

BACKGROUND

As a technique related to a power supply apparatus including a power generating circuit such as a solar cell and a power storage circuit such as a secondary battery, the following technique is known, for example.

For example, a clock with a solar cell is known, which includes a first switch coupled to a secondary battery in series and a first converter configured to control the first switch to an ON state and couple the secondary battery to the solar cell only when a voltage of the secondary battery is equal to or lower than a first voltage value. The clock with the solar cell further includes a second switch coupled to a clock circuit in series, a second converter configured to control the second switch to an ON state and couple the secondary battery to the clock circuit when the voltage of the secondary battery is equal to or higher than the first voltage value, and a third switch coupled to the first switch in parallel. In addition, the clock with the solar cell further includes a Schmitt comparator configured to control the third switch to an ON state and couple the solar cell to the secondary battery only when the voltage of the secondary battery is equal to or higher than the first voltage value and equal to or lower than a second voltage value higher than the first voltage value.

In addition, a power supply apparatus including a solar cell and a charging battery for storing energy generated by the solar cell is known, which includes a charging voltage control unit configured to discharge electric charges so that a charging voltage of a charging battery is reduced to a second level lower than a first level when the charging voltage of the charging battery reaches the first level.

Rerated techniques are disclosed in Japanese Unexamined Utility Model Registration Application Publication No. 63-7388 and Japanese Laid-open Patent Publication No. 7-250437.

SUMMARY

According to an aspect of the embodiments, a power supply apparatus includes, a power generating circuit that converts energy to power and output a voltage of the power, a first switch installed on either or both of a pair of power lines, a first switch control circuit that controls the first switch based on the level of the voltage, a second switch installed on a branched line coupled to the pair of power lines, a second switch control circuit that controls the second switch based on the level of the voltage, and controls the second switch so that the second switch is repeatedly turned on and off when a power storage circuit is charged with power generated by the power generating circuit, and the power storage circuit installed on the branched line and coupled to the power generating circuit when the first switch and the second switch are set to ON states.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENTS

Figure 1:
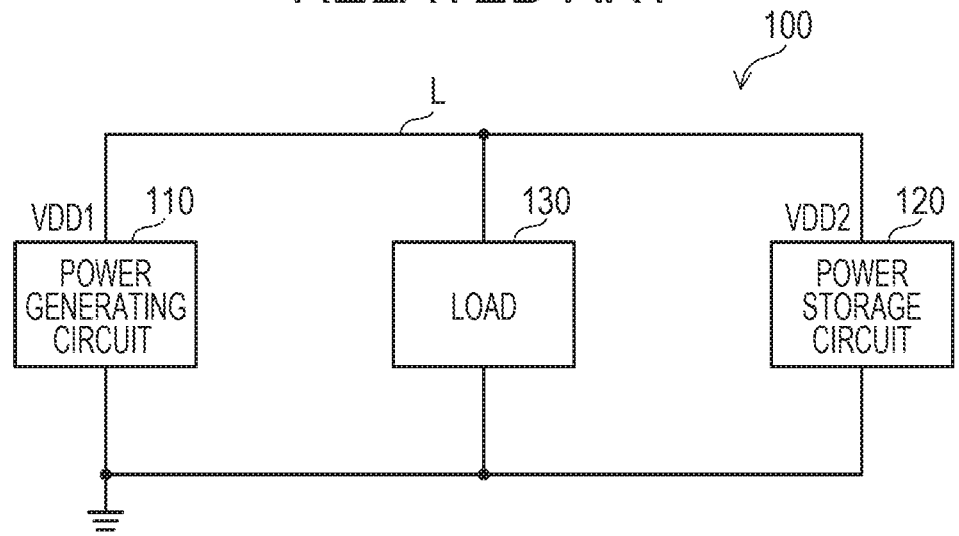
FIG. 1 is a diagram illustrating an example of a configuration of a power supply apparatus.

FIG. 1 is a diagram illustrating an example of a configuration of a power supply apparatus 100 including a power generating circuit 110 such as a solar cell and a power storage circuit 120 such as a secondary battery. Since the supply of power from the power generating circuit 110 configured to generate power from environmental energy may be unstable, power may be stably supplied to a load 130 by using both of the power generating circuit 110 and the power storage circuit 120. For example, in the case where the power generating circuit 110 is a solar cell, the power generating circuit 110 supplies power to the load 130 and the power storage circuit 120 is charged with power generated by the power generating circuit 110 in the day time (in a charging mode), and power stored in the power storage circuit 120 is supplied to the load 130 at night (in a discharging mode).

In the power supply apparatus 100 having the aforementioned configuration, when a voltage VDD1 of power generated by the power generating circuit 110 is lower than a charging voltage VDD2 of the power storage circuit 120, a current may flow back toward the power generating circuit 110 from the power storage circuit 120. When the current flows back, power stored in the power storage circuit 120 may be uselessly consumed. Thus, in order to inhibit the current from flowing back, it is preferable that the charging mode and the discharging mode be used and a current path between the power storage circuit 120 and the power supply circuit 110 be blocked in the discharging mode. In addition, it is preferable that an operational mode of the power supply apparatus 100 be switched from the charging mode to the discharging mode before the voltage VDD1 becomes lower than the charging voltage VDD2.

However, when the power generating circuit 110 is coupled to the power storage circuit 120 via a power line L without being decoupled from the power storage circuit 120, the voltage VDD1 is equal to the charging voltage VDD2 and it is difficult to switch the operational mode from the charging mode to the discharging mode at appropriate time.

Hereinafter, examples of embodiments of the disclosed techniques are described with reference to the accompanying drawings. Constituent elements and portions that are the same as or equivalent with each other in the drawings are indicated by the same reference symbols in the drawings.

First Embodiment

Figure 2:
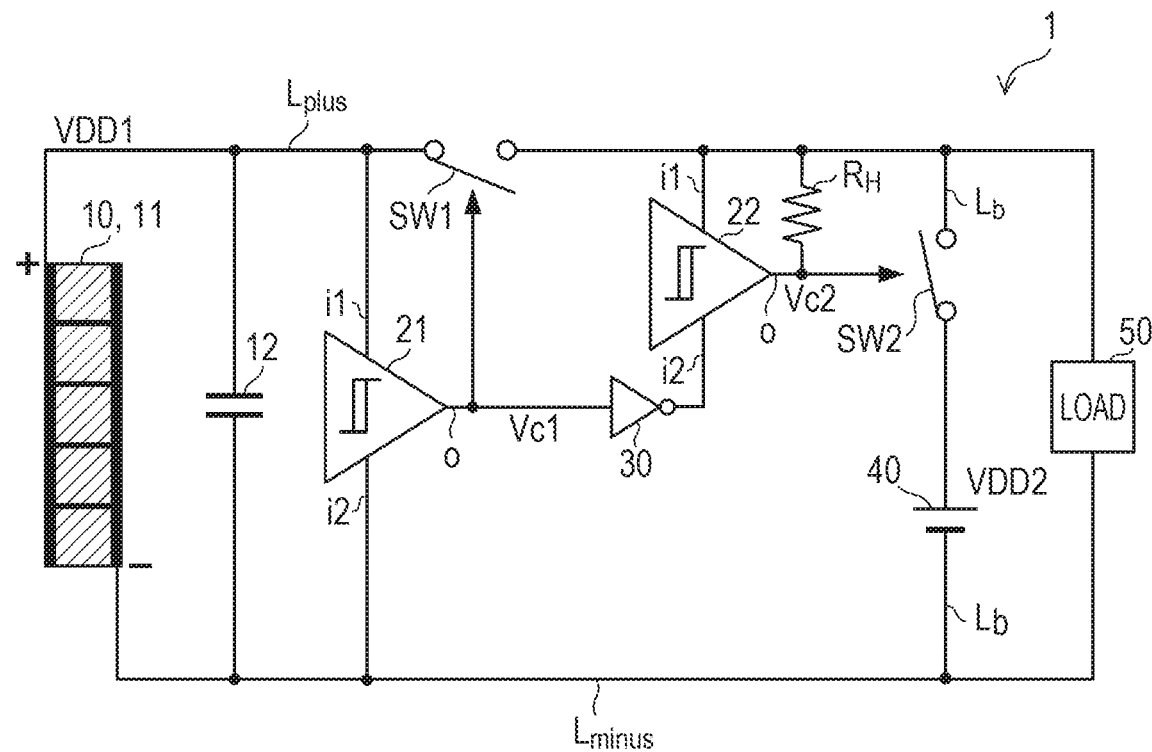
FIG. 2 is a diagram illustrating an example of a configuration of a power supply apparatus according to a first embodiment of the disclosed techniques.

FIG. 2 is a diagram illustrating an example of a configuration of a power supply apparatus 1 according to a first embodiment of the disclosed techniques. The power supply apparatus 1 includes a power generating circuit 10, a capacitor 12, a power storage circuit 40, a first switch SW1, a first switch control circuit 21, a second switch SW2, and a second switch control circuit 22. FIG. 2 illustrates the power supply 1 and a load 50 that receives power supplied from the power supply apparatus 1.

The power generating circuit 10 converts, for example, energy such as light, heat, vibration, or a radio wave to power and outputs the voltage of the power. Although examples in which a solar cell 11 is used as the power generating circuit 10 are described below, a power generating circuit other than solar cells may be used as the power generating circuit 10. When a power generating circuit that generates an alternating-current voltage from vibration, a radio wave, or the like is used, a converting device configured to convert the alternating-current voltage to a direct-current voltage may be used.

A positive electrode of the solar cell 11 is coupled to a positive-side power line $L_{plus}$, and a negative electrode of the solar cell 11 is coupled to a negative-side power line $L_{minus}$. The negative-side power line $L_{minus}$ may be a ground line. The voltage output from the solar cell 11 is applied to the power lines $L_{plus}$ and $L_{minus}$.

The first switch SW1 is installed on the power line $L_{plus}$ or the power line $L_{minus}$. The first switch SW1 is set to an ON state or an OFF state based on a control voltage Vc1 supplied from the first switch control circuit 21. The power line $L_{plus}$ is branched into a solar-cell-side portion and a load-side portion by the first switch SW1.

The capacitor 12 is coupled to the solar cell 11 in parallel. Specifically, one of electrodes of the capacitor 12 is coupled to the solar-cell-side portion of the power line $L_{plus}$, and the other of the electrodes of the capacitor 12 is coupled to the power line $L_{minus}$. The capacitor 12 stores power generated by the solar cell 11. As the capacitor 12, a capacitor having a smaller storage capacity than the power storage circuit 40 is used.

The first switch control circuit 21 includes a first input terminal i1 coupled to the power line $L_{plus}$, a second input terminal i2 coupled to the power line $L_{minus}$, and an output terminal o. The first switch control circuit 21 controls the turning on and off of the first switch SW1 based on the level of a voltage VDD1 generated between the power line $L_{plus}$ and the power line $L_{minus}$. When the level of the voltage VDD1 exceeds a first threshold VH1, the first switch control circuit 21 outputs a control voltage Vc1 to control the first switch SW1 to the ON state. On the other hand, when the level of the voltage VDD1 is lower than a second threshold VL1 lower than the first threshold VH1, the first switch control circuit 21 outputs a control voltage Vc1 to control the first switch SW1 to the OFF state.

The power storage circuit 40 and the second switch SW2 are installed on a branched line $L_b$ coupled to the power lines $L_{plus}$ and $L_{minus}$. One of ends of the branched line $L_b$ is coupled to the load-side portion of the power line $L_{plus}$, and the other of the ends of the branched line $L_b$ is coupled to the power line $L_{minus}$. Specifically, a series circuit that includes the second switch SW2 and the power storage circuit 40 is coupled to the solar cell 11 in parallel.

The power storage circuit 40 has a larger storage capacity than the capacitor 12 such as a secondary battery or a supercapacitor, for example. When the first switch SW1 is set to the ON state and the second switch SW2 is set to an ON state, the power storage circuit 40 is coupled to the solar cell 11 and charged. The second switch SW2 is switched to the ON state or an OFF state based on a control voltage Vc2 supplied from the second switch control circuit 22.

The second switch control circuit 22 includes a first input terminal i1 coupled to the load-side portion of the power line $L_{plus}$, a second input terminal i2 coupled to an output terminal of an inverter 30, and an output terminal o. The second switch control circuit 22 controls the turning on and off of the second switch SW2 based on the level of the voltage VDD1 generated between the power line $L_{plus}$ and the power line $L_{minus}$. When the level of the voltage VDD1 exceeds a third threshold VH2 higher than the first threshold VH1, the second switch control circuit 22 outputs a control voltage Vc2 to control the second switch SW2 to the ON state. On the other hand, when the level of the voltage VDD1 is lower than a fourth threshold VL2 lower than the third threshold VH2, the second switch control circuit 22 outputs a control voltage Vc2 to control the switch SW2 to the OFF state.

The second input terminal i2 of the second switch control circuit 22 is coupled to the output terminal o of the first switch control circuit 21 via the inverter 30. In addition, the output terminal o of the second switch control circuit 22 is coupled to one of ends of a pullup resistor $R_H$. The other of the ends of the pullup resistor $R_H$ is coupled to the power line $L_{plus}$. In this configuration, when the first switch control circuit 21 outputs the low-level control voltage Vc1 to control the first switch SW1 to the OFF state, a high-level voltage is input to the second input terminal i2 of the second switch control circuit 22. When the high-level voltage is input to the second input terminal i2 of the second switch control circuit 22, the second switch control circuit 22 outputs the high-level control voltage Vc2 to control the second switch SW2 to the ON state due to an effect of the pullup resistor $R_H$.

Figure 3:
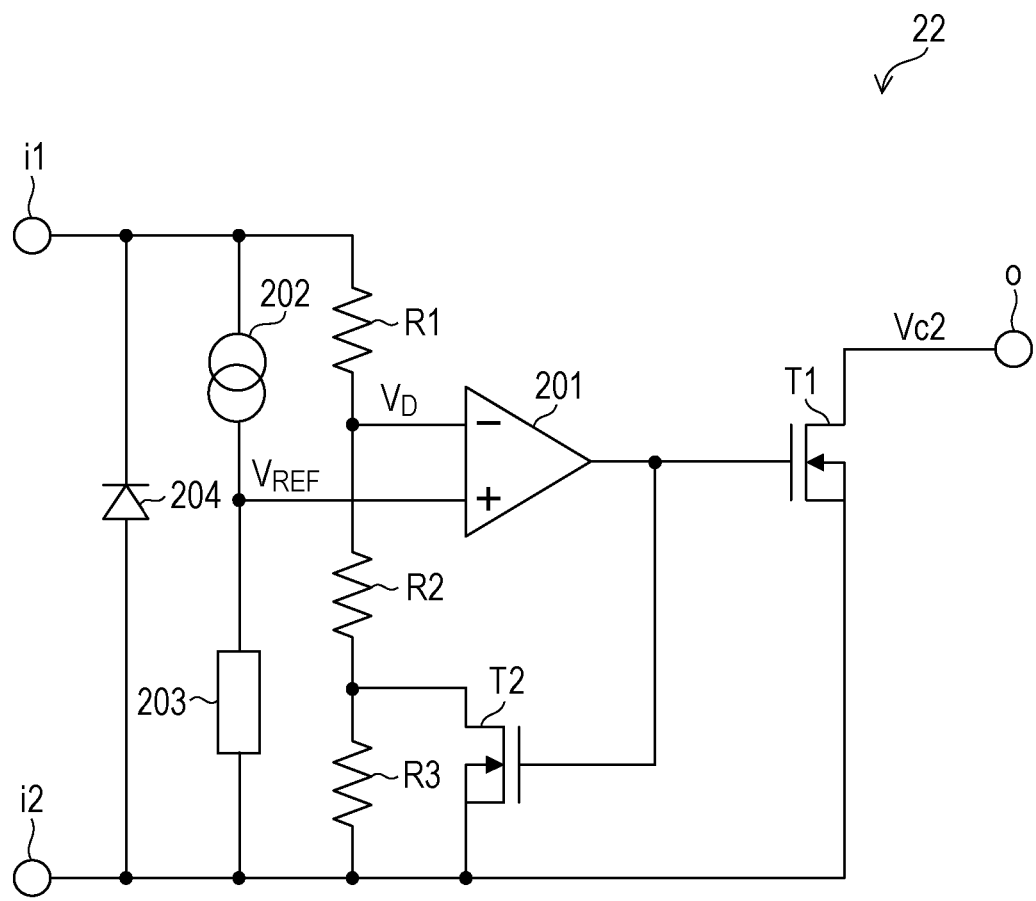
FIG. 3 is a diagram illustrating an example of a configuration of a second switch control circuit according to the first embodiment of the disclosed techniques.

FIG. 3 is a diagram illustrating a configuration of the second switch control circuit 22. The second switch control circuit 22 has a configuration of an open drain type hysteresis comparator at an output stage of the second switch control circuit 22. The second switch control circuit 22 includes resistance elements R1, R2, and R3, transistors T1 and T2, an operational amplifier circuit 201, a current source 202, a reference voltage circuit 203, and an electrostatic protection diode 204.

The operational amplifier circuit 201 outputs a high-level signal when the level of a detection voltage $V_D$ obtained by causing the resistance elements R1 to R3 to divide a voltage applied between the first input terminal i1 and the second input terminal i2 is lower than the level of a reference voltage $V_{REF}$. When the operational amplifier circuit 201 outputs the high-level signal, the transistors T1 and T2 are set to ON states, and the control voltage Vc2 output from the output terminal o is at a low level.

On the other hand, when the level of the detection voltage $V_D$ is higher than the level of the reference voltage $V_{REF}$, the operational amplifier circuit 201 outputs a low-level signal. When the operational amplifier circuit 201 outputs the low-level signal, the transistors T1 and T2 are set to OFF states, and the control voltage Vc2 output from the output terminal o is at the high level due to an effect of the pullup resistor $R_H$ (refer to FIG. 2). By turning on and off the transistor T2 based on the levels of the signals output from the operational amplifier circuit 201, division ratios of the resistance elements R1 to R3 are changed and a hysteresis characteristic is obtained in the second switch control circuit 22.

When the first switch control circuit 21 outputs the low-level control voltage Vc1 to turn off the first switch SW1, and the high-level voltage is input to the input terminal i2 of the second switch control circuit 22, the transistor T1 is set to the OFF state. In this case, the control voltage Vc2 output from the second switch control circuit 22 is at the high level due to an effect of the pullup resistor $R_H$ (refer to FIG. 2). The first switch control circuit 21 may have the same configuration as the configuration of the second switch control circuit 22.

The load 50 is coupled to the series circuit including the second switch SW2 and the power storage circuit 40 in parallel. When the first switch SW1 is set to the ON state, the load 50 is coupled to the solar cell 11, and power is supplied to the load 50 from the solar cell 11. When the second switch SW2 is set to the ON state, the load 50 is coupled to the power storage circuit 40, and power is supplied to the load 50 from the power storage circuit 40.

Figure 4:
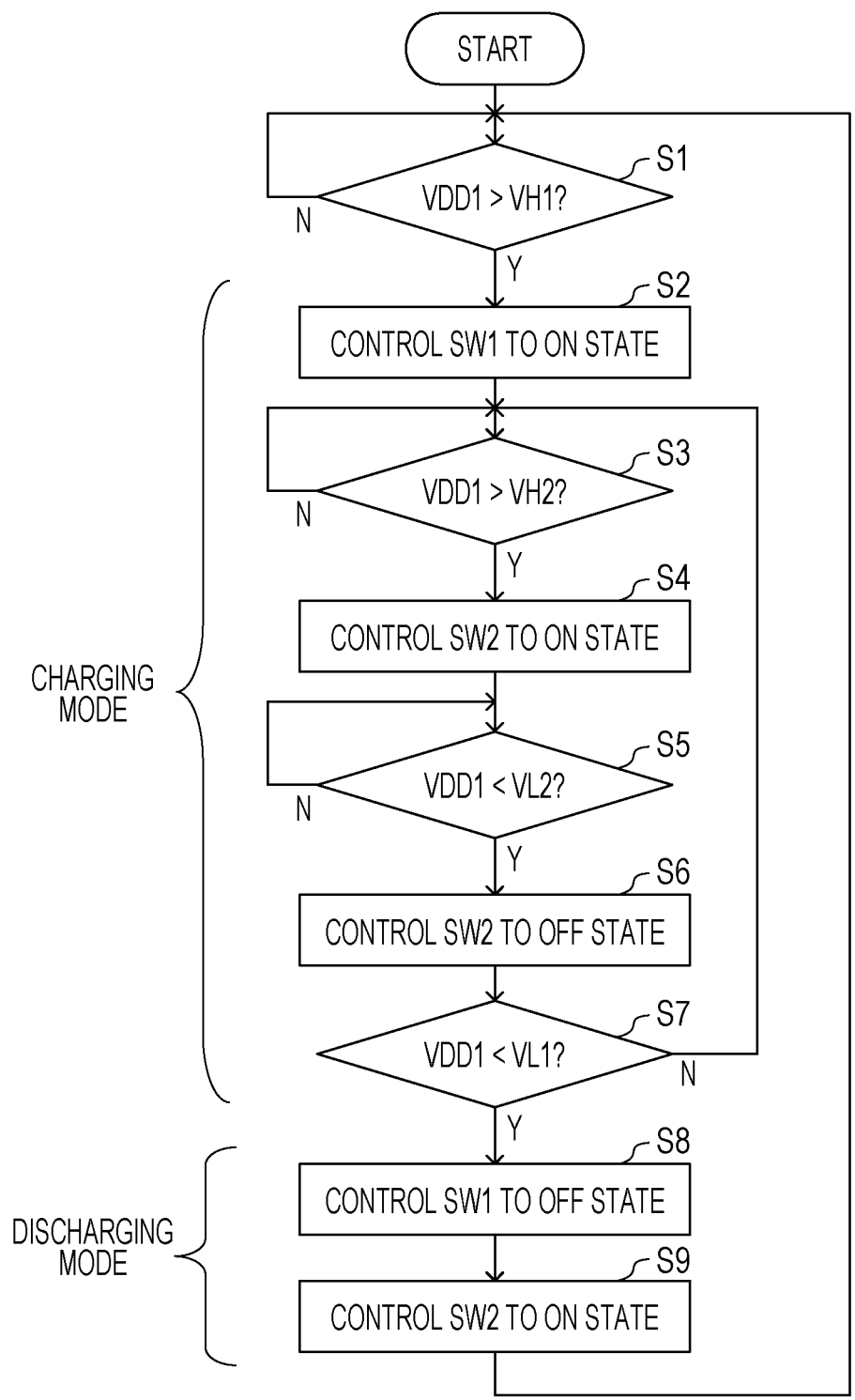
FIG. 4 is a flowchart of an example of an operational sequence of the power supply apparatus according to the first embodiment of the disclosed techniques.
Figure 5:
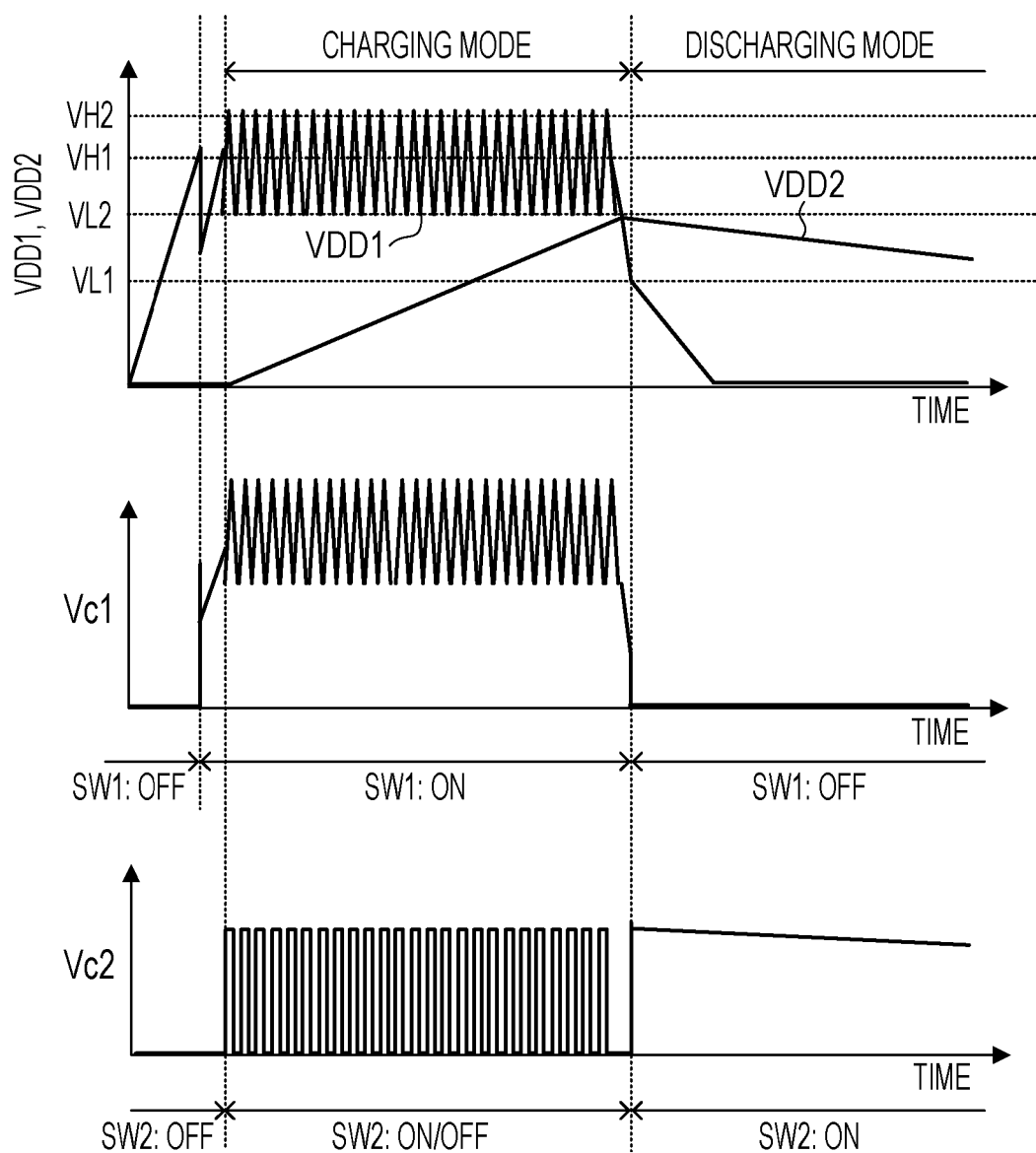
FIG. 5 is a diagram illustrating an example of operational waveforms of the power supply apparatus according to the first embodiment of the disclosed techniques.

Operations of the power supply apparatus 1 are described below. FIG. 4 is a flowchart of an example of an operational sequence of the power supply apparatus 1. FIG. 5 is a diagram illustrating an example of operational waveforms of the power supply apparatus 1. An upper graph illustrated in FIG. 5 indicates an example of a waveform of the voltage VDD1 generated between the power line $L_{plus}$ and the power line $L_{minus}$ and an example of a waveform of the charging voltage VDD2 of the power storage circuit 40. A middle graph illustrated in FIG. 5 indicates an example of a waveform of the control voltage Vc1 output from the first switch control circuit 21. A lower graph illustrated in FIG. 5 indicates an example of a waveform of the control voltage Vc2 output from the second switch control circuit 22. In an initial state, the first switch SW1 and the second switch SW2 are in the OFF states.

When the intensity of light with which the solar cell 11 is irradiated increases, the amount of power generated by the solar cell 11 per unit of time increases, and the level of the voltage VDD1 generated between the power line $L_{plus}$ and the power line $L_{minus}$ increases. Power generated by the solar cell 11 is stored in the capacitor 12. The first switch control circuit 21 determines whether or not the level of the voltage VDD1 exceeds the first threshold VH1 (in step S1).

When the first switch control circuit 21 detects that the level of the voltage VDD1 exceeds the first threshold VH1, the first switch control circuit 21 outputs the high-level control voltage Vc1. By executing this, the first switch SW1 is set to the ON state (in step S2). When the first switch SW1 is set to the ON state, power is supplied to the load 50.

The control voltage Vc1 output from the first switch control circuit 21 passes through the inverter 30 and is thereby inverted to the low level and is input to the second input terminal i2 of the second switch control circuit 22. Then, when the first switch SW1 is set to the ON state and the low-level voltage is applied to the second input terminal i2 of the second switch control circuit 22, the second switch control circuit 22 may detect the level of the voltage VDD1.

The second switch control circuit 22 determines whether or not the level of the voltage VDD1 exceeds the third threshold VH2 (>VH1) (in step S3). When the second switch control circuit 22 detects that the level of the voltage VDD1 exceeds the third threshold VH2, the second switch control circuit 22 outputs the high-level control voltage Vc2. By executing this, the second switch SW2 is set to the ON state (in step S4).

When the first switch SW1 and the second switch SW2 are set to the ON states, the power storage circuit 40 is coupled to the solar cell 11 and the capacitor 12 and charged with power generated by the solar cell 11. Since the power storage circuit 40 has the larger storage capacity than the capacitor 12, the level of the voltage VDD1 is reduced due to movements of electric charges from the capacitor 12 to the power storage circuit 40.

The second switch control circuit 22 determines whether or not the level of the voltage VDD1 is lower than the fourth threshold VL2 (<VH2) (in step S5). When the second switch control circuit 22 detects that the level of the voltage VDD1 is lower than the fourth threshold VL2, the second switch control circuit 22 outputs the low-level control voltage Vc2. By executing this, the second switch SW2 is set to the OFF state (in step S6).

When the second switch SW2 is set to the OFF state, the power storage circuit 40 is disconnected from the solar cell 11 and the capacitor 12. When the amount of power generated by the solar cell 11 is relatively large (or when the answer to determination of step S7 is negative), and the second switch SW2 is set to the OFF state, the level of the voltage VDD1 increases again. In this case, the processes of steps S3 to S6 are repeatedly executed and the second switch SW2 is repeatedly turned on and off.

FIG. 5 illustrates a state in which the second switch SW2 is repeatedly turned on and off and the level of the voltage VDD1 frequently changes between the third threshold VH2 and the fourth threshold VL2. During the time when the second switch SW2 is repeatedly turned on and off, the charging voltage VDD2 of the power storage circuit 40 gradually increases. When the amount of power generated by the solar cell 11 is relatively large, the second switch SW2 continues to be repeatedly turned on and off as long as the charging voltage VDD2 does not exceed the fourth threshold VL2. During the time when the second switch SW2 is repeatedly turned on and off, the power storage circuit 40 is intermittently charged. When the amount of power generated by the solar cell 11 per unit of time is relatively large, the power supply apparatus 1 operates in a charging mode in which the power storage circuit 40 supplies power to the load 50 while being charged with power generated by the solar cell 11.

When the intensity of light with which the solar cell 11 is irradiated is reduced, the amount of power generated by the solar cell 11 per unit of time is reduced and the level of the voltage VDD1 is reduced. The first switch control circuit 21 determines whether or not the level of the voltage VDD1 is lower than the second threshold VL1 (in step S7). When the first switch control circuit 21 detects that the level of the voltage VDD1 is lower than the second threshold VL1, the first switch control circuit 21 outputs the low-level control voltage Vc1. By executing this, the first switch SW1 is set to the OFF state (in step S8).

The low-level control voltage Vc1 output from the first switch control circuit 21 passes through the inverter 30 and is thereby inverted to the high level and is input to the second input terminal i2 of the second switch control circuit 22. When the high-level voltage is input to the second input terminal i2 of the second switch control circuit 22, the second switch control circuit 22 outputs the high-level control voltage Vc2 due to an effect of the pullup resistor $R_H$. By executing this, the second switch SW2 is set to the ON state (in step S9).

When the first switch SW1 is set to the OFF state and the second switch SW2 is set to the ON state, an operational mode of the power supply apparatus 1 is switched to a discharging mode in which power stored in the power storage circuit 40 is supplied to the load 50. In the discharging mode, the first switch SW1 is in the OFF state and the power storage circuit 40 is decoupled from the solar cell 11. In the discharging mode, the second switch control circuit 22 may continuously operate with power stored in the power storage circuit 40.

As described above, when a surrounding of the power supply apparatus 1 is bright and the amount of power generated by the solar cell 11 per unit of time is relatively large, the power supply apparatus 1 operates in the charging mode in which the power storage circuit 40 supplies power to the load 50 while being charged with power generated by the solar cell 11. In the charging mode, the second switch SW2 is repeatedly turned on and off, the power storage circuit 40 is intermittently charged, and the level of the voltage VDD1 generated between the power line $L_{plus}$ and the power line $L_{minus}$ is not equal to the level of the charging voltage VDD2 of the power storage circuit (VDD1≠VDD2). Thus, in the discharging mode, the voltage of the power generated by the solar cell 11 may be detected without being affected by the charging voltage VDD2 of the power storage circuit 40.

On the other hand, when the surrounding of the power supply apparatus 1 is dark and the amount of power generated by the solar cell 11 per unit of time is relatively small, the power supply apparatus 1 operates in the discharging mode in which power stored in the power storage circuit 40 is supplied to the load 50. In the discharging mode, the first switch SW1 is in the OFF state, and the power storage circuit 40 is decoupled from the solar cell 11.

As described above, in the charging mode, the first switch control circuit 21 may detect the level of the voltage of the power generated by the solar cell 11 while the voltage generated by the solar cell 11 is not affected by the charging voltage VDD2 of the power storage circuit 40. Thus, the operational mode may be switched from the charging mode to the discharging mode at appropriate time. Specifically, before the voltage VDD1 becomes lower than the charging voltage VDD2, and a current flows back toward the solar cell 11 from the power storage circuit 40, the first switch SW1 may be set to the OFF state so that a current path is blocked. By inhibiting the current from flowing back, it may be possible to inhibit power stored in the power storage circuit 40 from being uselessly consumed.

The following case assumes that the power storage device 40 is a secondary battery having a capacity of, for example, 1 mAh, a current consumed by the load 50 is, for example, 1 μA, and a current flowing back toward the solar cell 11 from the power storage circuit 40 is, for example, 1 μA. In this case, if the current is not inhibited from flowing back, a time period for driving the load 50 with power stored in the power storage circuit 40 is approximately 500 hours. On the other hand, the power supply apparatus 1 according to the first embodiment of the disclosed techniques may inhibit a current from flowing back and drive the load 50 with power stored in the power storage circuit 40 during a time period of approximately 1000 hours.

Figure 6:
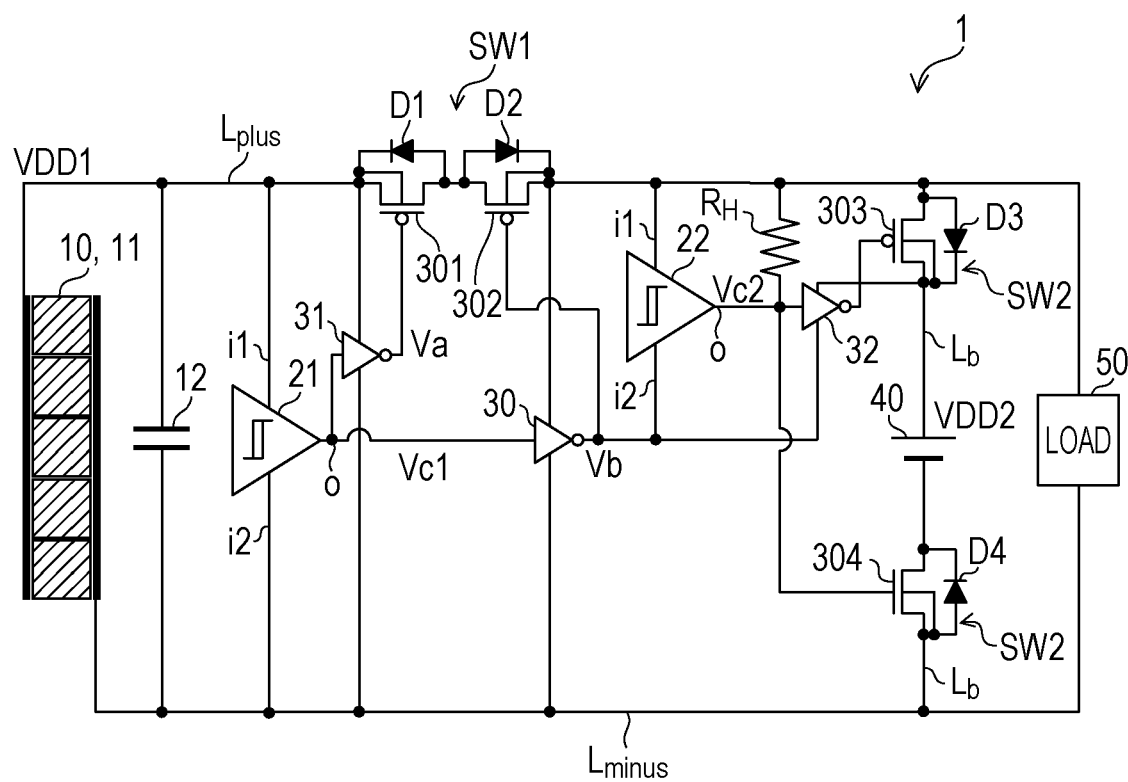
FIG. 6 is a diagram illustrating an example of the configuration of the power supply apparatus according to the first embodiment of the disclosed techniques.

FIG. 6 is a diagram illustrating an example of the configuration of the power supply apparatus 1 and illustrating configurations of the first and second switches SW1 and SW2 in detail.

In the example illustrated in FIG. 6, the first switch SW1 includes two P-channel metal-oxide-semiconductor field-effect transistors (MOSFETs) 301 and 302 (hereinafter referred to as P-MOSs 301 and 302). The P-MOSs 301 and 302 have parasitic diodes D1 and D2 with anodes coupled to drains of the P-MOSs 301 and 302 and cathodes coupled to sources of the P-MOSs 301 and 302, respectively. The P-MOSs 301 and 302 are installed on the power line $L_{plus}$ so that the orientation of the parasitic diode D1 is opposite to the orientation of the parasitic diode D2. Specifically, the source of the P-MOS 301 is coupled to the solar-cell-side portion of the power line $L_{plus}$, and the drain of the P-MOS 301 is coupled to the drain of the P-MOS 302. The source of the P-MOS 302 is coupled to the load-side portion of the power line $L_{plus}$.

A gate of the P-MOS 301 is coupled to the output terminal o of the first switch control circuit 21 via an inverter 31, while a gate of the P-MOS 302 is coupled to the output terminal o of the first switch control circuit 21 via the inverter 30. The inverter 31 operates using, as a power supply voltage, a voltage generated between the solar-cell-side portion of the power line $L_{plus}$ and the power line $L_{minus}$. The inverter 30 operates using, as a power supply voltage, a voltage generated between the load-side portion of the power line $L_{plus}$ and the power line $L_{minus}$.

The second switch SW2 includes a P-channel MOSFET 303 (hereinafter referred to as P-MOS 303) and an N-channel MOSFET 304 (hereinafter referred to as N-MOS 304). The P-MOS 303 has a parasitic diode D3 with an anode coupled to a drain of the P-MOS 303 and a cathode coupled to a source of the P-MOS 303. The N-MOS 304 has a parasitic diode D4 with an anode coupled to a source of the N-MOS 304 and a cathode coupled to a drain of the N-MOS 304. The P-MOS 303 and the N-MOS 304 are installed on the branched line $L_b$ so that the orientation of the parasitic diode D3 is opposite to the orientation of the parasitic diode D4. Specifically, the drain of the P-MOS 303 is coupled to the load-side portion of the power line $L_{plus}$, and the source of the P-MOS 303 is coupled to a positive electrode of the power storage circuit 40. The drain of the N-MOS 304 is coupled to a negative electrode of the power storage circuit 40, and the source of the N-MOS 304 is coupled to the power line $L_{minus}$.

A gate of the P-MOS 303 is coupled to the output terminal o of the second switch control circuit 22 via an inverter 32. A gate of the N-MOS 304 is coupled to the output terminal o of the second switch control circuit 22. The inverter 32 operates using, as a power supply voltage, a voltage generated between the positive electrode of the power storage circuit 40 and an output terminal of the inverter 30.

In the charging mode, the P-MOSs 301 and 302 that form the first switch SW1 are in ON states, and the P-MOS 303 and the N-MOS 304 that form the second switch SW2 are repeatedly turned on and off. In the discharging mode, the P-MOSs 301 and 302 that form the first switch SW1 are in OFF states, and the P-MOS 303 and the N-MOS 304 that form the second switch SW2 are in the ON states.

Since the first switch SW1 and the second switch SW2 have the aforementioned configurations, it may be possible to inhibit a current from flowing back toward the solar cell 11 from the power storage circuit 40. For example, when the intensity of light with which the solar cell 11 is irradiated is reduced, the following inequalities may be established. VL1<VDD1<VDD2<VL2. In this case, the P-MOSs 301 and 302 that form the first switch SW1 are maintained in the ON states, and the P-MOS 303 and the N-MOS 304 that form the second switch SW2 are in the OFF states. In this case, if the second switch SW2 includes the N-MOS 304 and does not include the P-MOS 303, the N-MOS 304 is in the OFF state, but a current flows toward the solar cell 11 via the parasitic diode D4 coupled to the N-MOS 304. Since the second switch SW2 includes the P-MOS 303 and the N-MOS 304 so that the orientation of the parasitic diode D3 is opposite to the orientation of the parasitic diode D4, it may be possible to inhibit a current from flowing back toward the solar cell 11.

In addition, when the intensity of light with which the solar cell 11 is irradiated is reduced, the following inequalities may be established. VDD1<VL1<VDD2. In this case, the power supply apparatus 1 is in the charging mode, the P-MOSs 301 and 302 that form the first switch SW1 are in the OFF states, and the P-MOS 303 and the N-MOS 304 that form the second switch SW2 are in the ON states. In this case, if the first switch SW1 includes the P-MOS 301 and does not include the P-MOS 302, the P-MOS 301 is in the OFF state, and a current flows toward the solar cell 11 via the parasitic diode D1 coupled to the P-MOS 301. Since the first switch SW1 includes the P-MOSs 301 and 302 so that the orientation of the parasitic diode D1 is opposite to the orientation of the parasitic diode D2, it may be possible to inhibit a current from flowing toward the solar cell 11.

Figure 7:
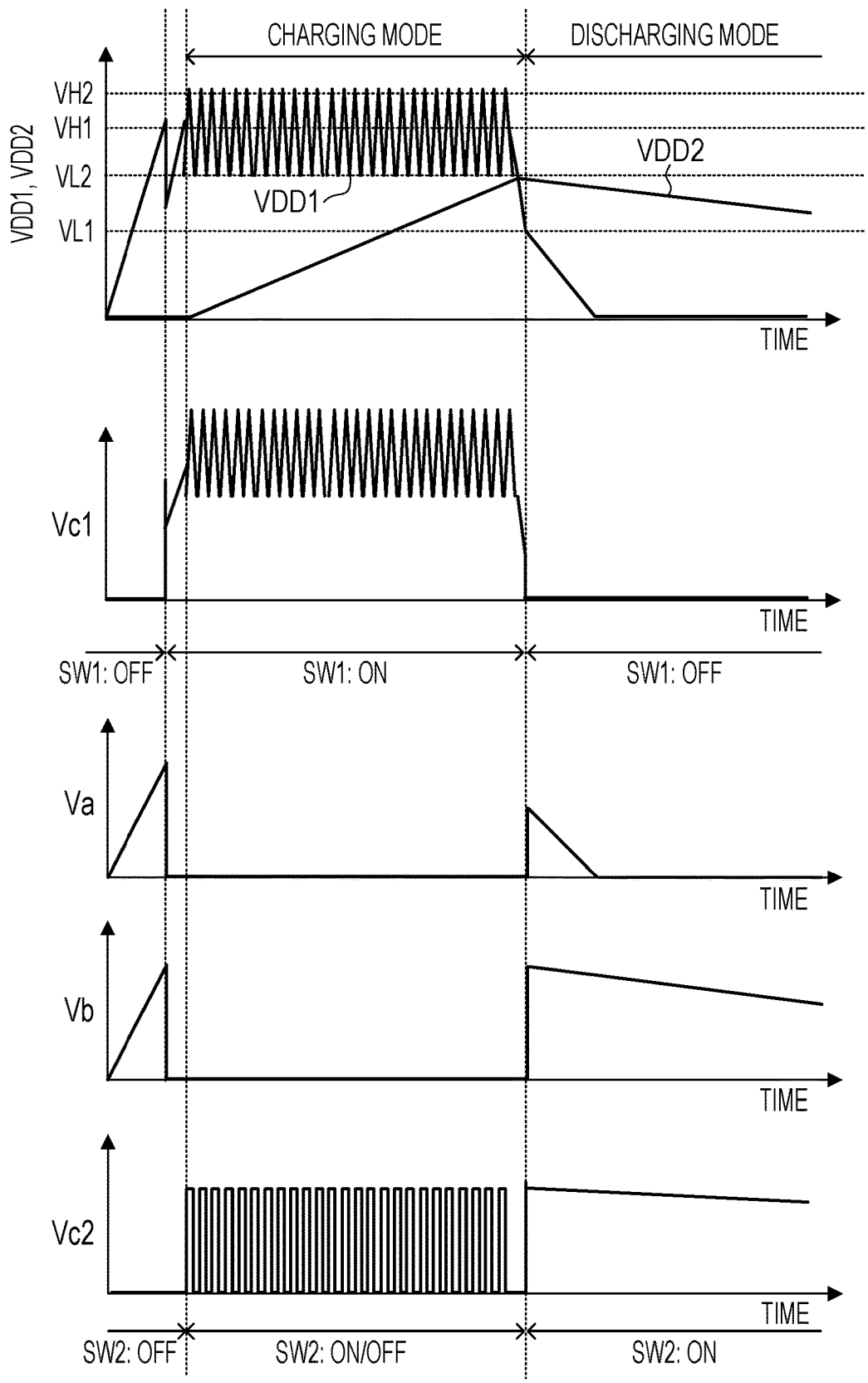
FIG. 7 is a diagram illustrating an example of operational waveforms of the power supply apparatus according to the first embodiment of the disclosed techniques.

FIG. 7 is a diagram illustrating an example of operational waves of the power supply apparatus 1 having the configuration illustrated in FIG. 6. FIG. 7 illustrates a waveform of an output voltage (applied to the gate of the P-MOS 301) Va of the inverter 31 and a waveform of an output voltage (applied to the gate of the P-MOS 302) Vb of the inverter 30. The inverter 30 operates using, as a power supply voltage, the voltage generated between the load-side portion of the power line $L_{plus}$ and the power line $L_{minus}$. Thus, even in the discharging mode, the inverter 30 may continuously operate with power stored in the power storage circuit 40. Thus, as illustrated in FIG. 7, in the discharging mode, the voltage Vb applied to the gate of the P-MOS 302 may be maintained at the high level, and the P-MOS 302 may be maintained in the OFF state.

In the discharging mode, since the voltage of power generated by the solar cell 11 is reduced and the voltage Va applied to the gate of the P-MOS 301 may be at a low level, the P-MOS 301 may be in the ON state. In the discharging mode, since the voltage Vb applied to the gate of the P-MOS 302 may be maintained at a high level, the P-MOS 302 may be reliably set to the OFF state. Thus, in the discharging mode, it may be possible to inhibit a current from flowing toward the solar cell 11 from the power storage circuit 40.

FIGS. 8A, 8B, 8C, and 8D are diagrams illustrating variations in the configuration of the second switch SW2.

Figure 8A:
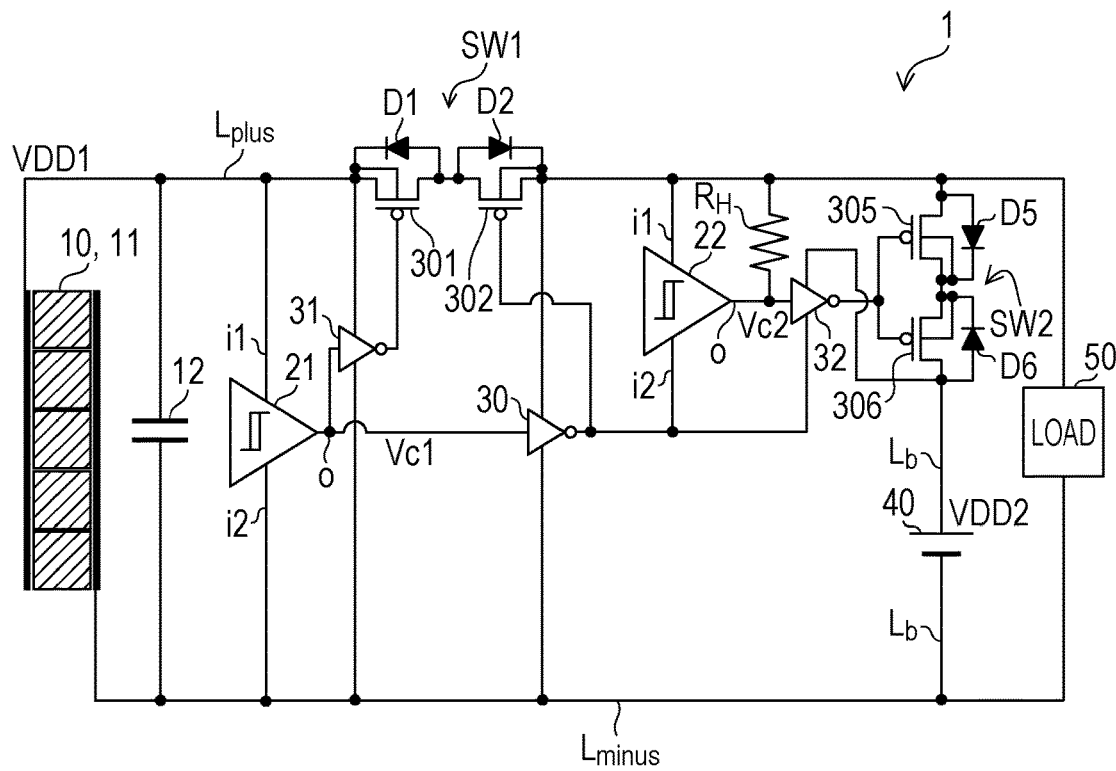
FIG. 8A is a diagram illustrating an example of the configuration of the power supply apparatus according to the first embodiment of the disclosed techniques.

In an example illustrated in FIG. 8A, the second switch SW2 includes two P-channel MOSFETs 305 and 306 (hereinafter referred to as P-MOSs 305 and 306). The P-MOSs 305 and 306 have parasitic diodes D5 and D6 with anodes coupled to drains of the P-MOSs 305 and 306 and cathodes coupled to sources of the P-MOSs 305 and 306, respectively. The P-MOSs 305 and 306 are installed on the branched line $L_b$ so that the orientation of the parasitic diode D5 is opposite to the orientation of the parasitic diode D6. Specifically, the drain of the P-MOS 305 is coupled to the load-side portion of the power line $L_{plus}$, and the source of the P-MOS 305 is coupled to the source of the P-MOS 306. The drain of the P-MOS 306 is coupled to the positive electrode of the power storage circuit 40. The P-MOSs 305 and 306 have gates coupled to the output terminal o of the second switch control circuit 22 via the inverter 32, respectively.

Figure 8B:
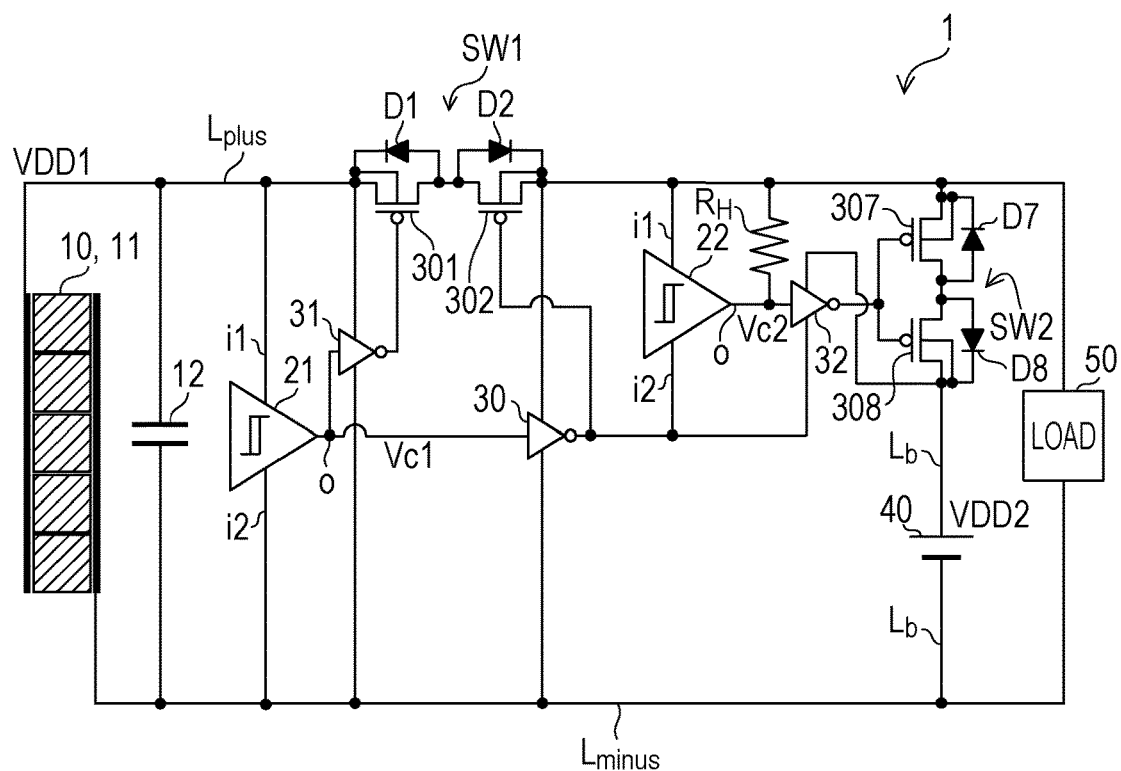
FIG. 8B is a diagram illustrating an example of the configuration of the power supply apparatus according to the first embodiment of the disclosed techniques.

In an example illustrated in FIG. 8B, the second switch SW2 includes two P-channel MOSFETs 307 and 308 (hereinafter referred to as P-MOSs 307 and 308). The P-MOSs 307 and 308 have parasitic diodes D7 and D8 with anodes coupled to drains of the P-MOSs 307 and 308 and cathodes coupled to sources of the P-MOSs 307 and 308, respectively. The P-MOSs 307 and 308 are installed on the branched line $L_b$ so that the orientation of the parasitic diode D7 is opposite to the orientation of the parasitic diode D8. Specifically, the source of the P-MOS 307 is coupled to the load-side portion of the power line $L_{plus}$, and the drain of the P-MOS 307 is coupled to the drain of the P-MOS 308. The source of the P-MOS 308 is coupled to the positive electrode of the power storage circuit 40. The P-MOSs 307 and 308 have gates coupled to the output terminal o of the second switch control circuit 22 via the inverter 32, respectively.

Figure 8C:
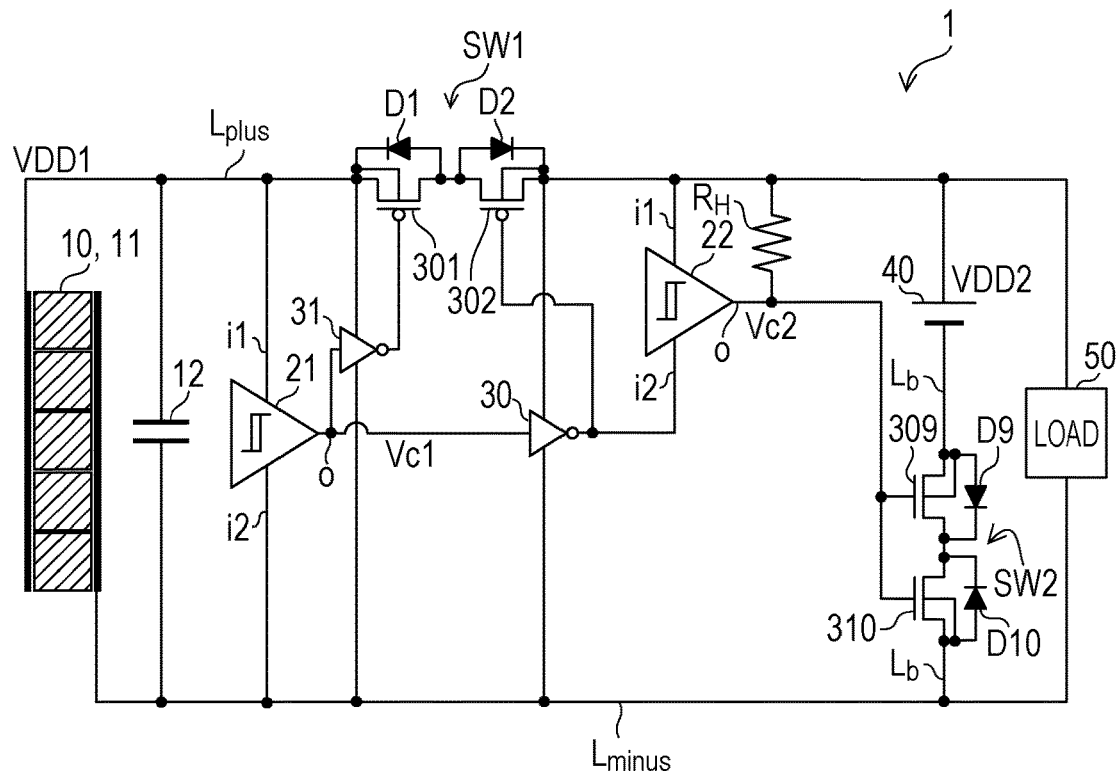
FIG. 8C is a diagram illustrating an example of the configuration of the power supply apparatus according to the first embodiment of the disclosed techniques.

In an example illustrated in FIG. 8C, the second switch SW2 includes two N-channel MOSFETs 309 and 310 (hereinafter referred to as N-MOSs 309 and 310). The N-MOSs 309 and 310 have parasitic diodes D9 and D10 with anodes coupled to sources of the N-MOSs 309 and 310 and cathodes coupled to drains of the N-MOSs 309 and 310, respectively. The N-MOSs 309 and 310 are installed on the branched line $L_b$ so that the orientation of the parasitic diode D9 is opposite to the orientation of the parasitic diode D10. Specifically, the source of the N-MOS 309 is coupled to the negative electrode of the power storage circuit 40, and the drain of the N-MOS 309 is coupled to the drain of the N-MOS 310. The source of the N-MOS 310 is coupled to the power line $L_{minus}$. The N-MOSs 309 and 310 have gates coupled to the output terminal o of the second switch control circuit 22, respectively.

Figure 8D:
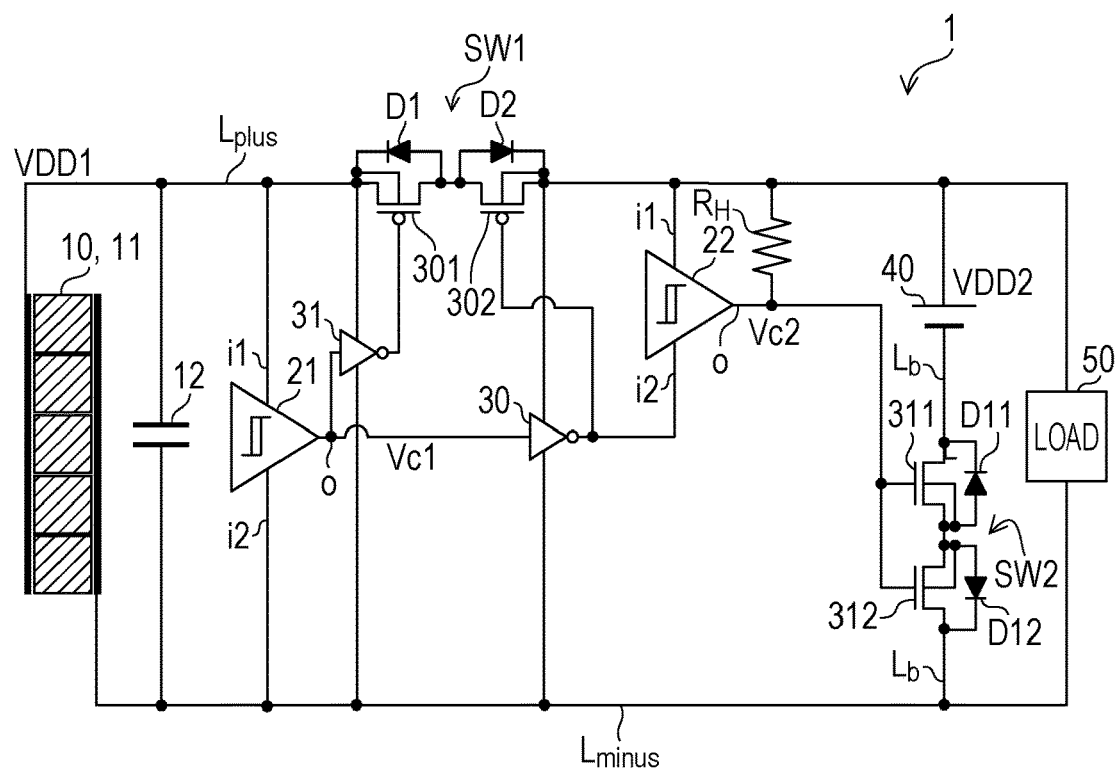
FIG. 8D is a diagram illustrating an example of the configuration of the power supply apparatus according to the first embodiment of the disclosed techniques.

In an example illustrated in FIG. 8D, the second switch SW2 includes two N-channel MOSFETs 311 and 312 (hereinafter referred to as N-MOSs 311 and 312). The N-MOSs 311 and 312 have parasitic diodes D11 and D12 with anodes coupled to sources of the N-MOSs 311 and 312 and cathodes coupled to drains of the N-MOSs 311 and 312, respectively. The N-MOSs 311 and 312 are installed on the branched line $L_b$ so that the orientation of the parasitic diode D11 is opposite to the orientation of the parasitic diode D12. Specifically, the drain of the N-MOS 311 is coupled to the negative electrode of the power storage circuit 40, and the source of the N-MOS 311 is coupled to the source of the N-MOS 312. The drain of the N-MOS 312 is coupled to the power line $L_{minus}$. The N-MOSs 311 and 312 have gates coupled to the output terminal o of the second switch control circuit 22, respectively.

The configurations illustrated in FIGS. 8A to 8D may inhibit a current from flowing back in the discharging mode.

Figure 9A:
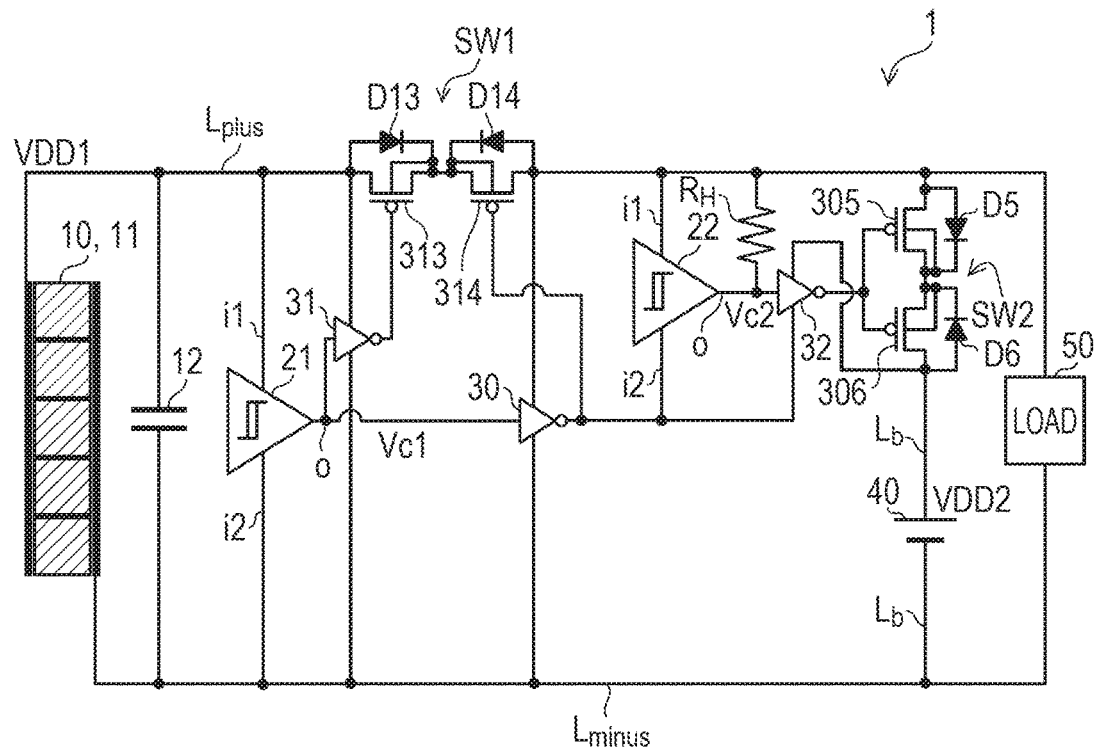
FIG. 9A is a diagram illustrating an example of the configuration of the power supply apparatus according to the first embodiment of the disclosed techniques.
Figure 9B:
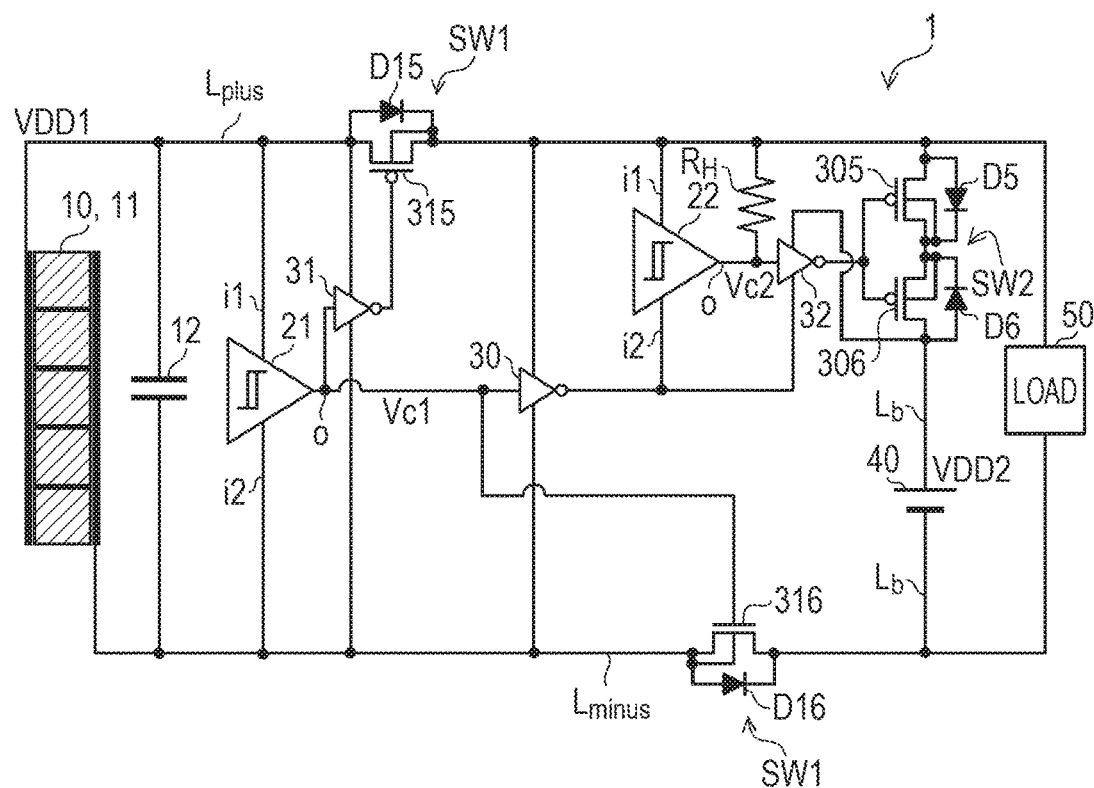
FIG. 9B is a diagram illustrating an example of the configuration of the power supply apparatus according to the first embodiment of the disclosed techniques.
Figure 9C:
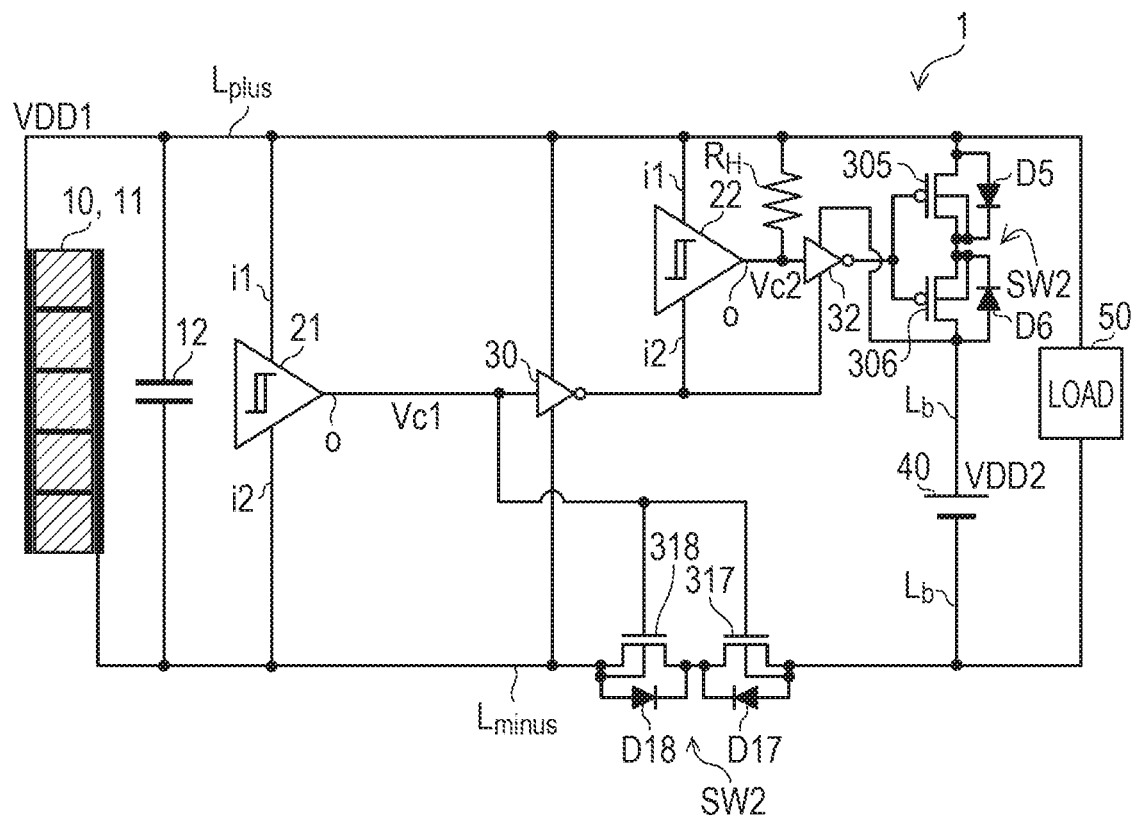
FIG. 9C is a diagram illustrating an example of the configuration of the power supply apparatus according to the first embodiment of the disclosed techniques.

FIGS. 9A, 9B, and 9C are diagrams illustrating variations in the configuration of the first switch SW1.

In an example illustrated in FIG. 9A, the first switch SW1 includes two P-channel MOSFETs 313 and 314 (hereinafter referred to as P-MOSs 313 and 314). The P-MOSs 313 and 314 have parasitic diodes D13 and D14 with anodes coupled to drains of the P-MOSs 313 and 314 and cathodes coupled to sources of the P-MOSs 313 and 314, respectively. The P-MOSs 313 and 314 are installed on the power line $L_{plus}$ so that the orientation of the parasitic diode D13 is opposite to the orientation of the parasitic diode D14. Specifically, the drain of the P-MOS 313 is coupled to the solar-cell-side portion of the power line $L_{plus}$, and the source of the P-MOS 313 is coupled to the source of the P-MOS 314. The drain of the P-MOS 314 is coupled to the load-side portion of the power line $L_{plus}$. A gate of the P-MOS 313 is coupled to the output terminal o of the first switch control circuit 21 via the inverter 31, while a gate of the P-MOS 314 is coupled to the output terminal o of the first switch control circuit 21 via the inverter 30.

In an example illustrated in FIG. 9B, the first switch SW1 includes a P-channel MOSFET 315 (hereinafter referred to as P-MOS 315) and an N-channel MOSFET 316 (hereinafter referred to as N-MOS 316). The P-MOS 315 has a parasitic diode D15 with an anode coupled to a drain of the P-MOS 315 and a cathode coupled to a source of the P-MOS 315. The N-MOS 316 has a parasitic diode D16 with an anode coupled to a source of the N-MOS 316 and a cathode coupled to a drain of the N-MOS 316. The drain of the P-MOS 315 is coupled to the solar-cell-side portion of the power line $L_{plus}$, and the source of the P-MOS 315 is coupled to the load-side portion of the power line $L_{plus}$. The drain of the N-MOS 316 is coupled to the power line $L_{minus}$ on the side of the load 50, and the source of the N-MOS 316 is coupled to the power line $L_{minus}$ on the side of the solar cell 11. A gate of the P-MOS 315 is coupled to the output terminal o of the first switch control circuit 21 via the inverter 31, while a gate of the N-MOS 316 is coupled to the output terminal o of the first switch control circuit 21.

In an example illustrated in FIG. 9C, the first switch SW1 includes two N-channel MOSFETs 317 and 318 (hereinafter referred to as N-MOSs 317 and 318). The N-MOSs 317 and 318 have parasitic diodes D17 and D18 with anodes coupled to sources of the N-MOSs 317 and 318 and cathodes coupled to drains of the N-MOSs 317 and 318, respectively. The N-MOSs 317 and 318 are installed on the power line $L_{minus}$ so that the orientation of the parasitic diode D17 is opposite to the orientation of the parasitic diode D18. Specifically, the source of the N-MOS 317 is coupled to the power line $L_{minus}$ on the side of the load 50, and the drain of the N-MOS 317 is coupled to the drain of the N-MOS 318. The source of the N-MOS 318 is coupled to the power line $L_{minus}$ on the side of the solar cell 11. The N-MOSs 317 and 318 have gates coupled to the output terminal o of the first switch control circuit 21, respectively.

The configurations illustrated in FIGS. 9A to 9C may inhibit a current from flowing back in the discharging mode.

Second Embodiment

Figure 10:
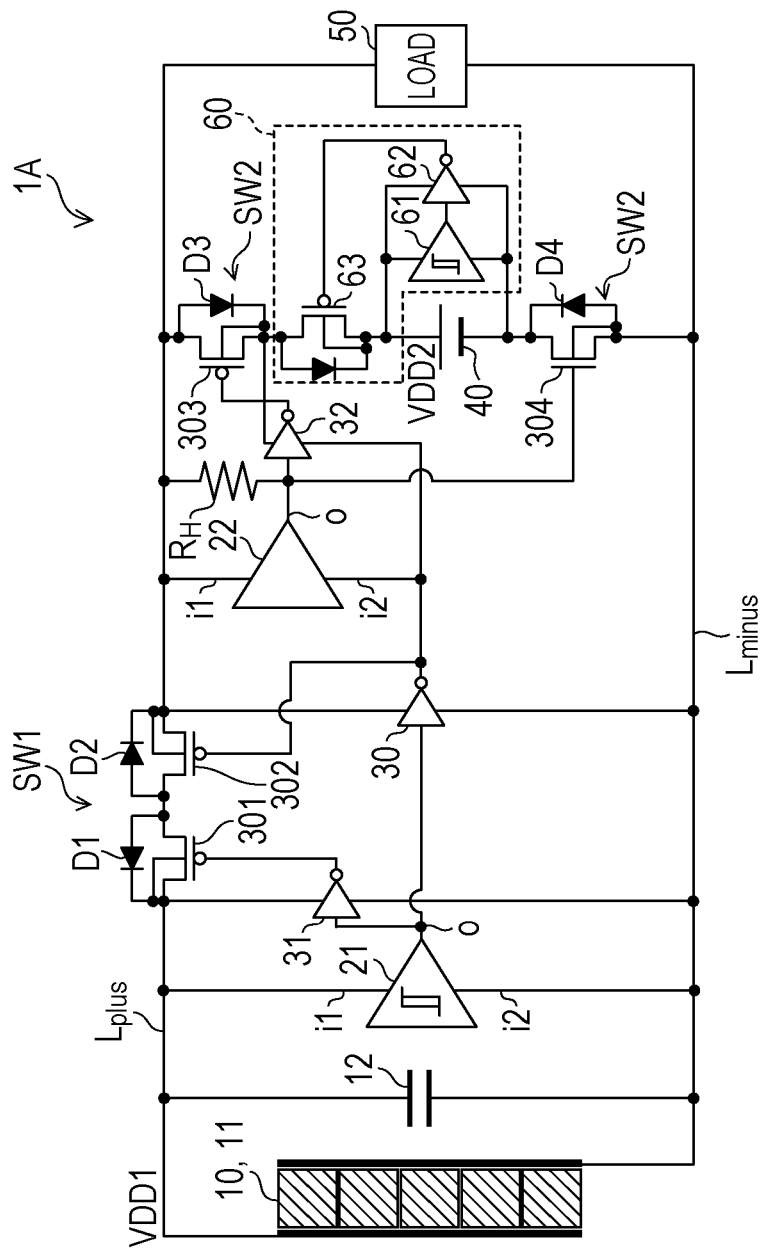
FIG. 10 is a diagram illustrating an example of a configuration of a power supply apparatus according to a second embodiment of the disclosed techniques.

FIG. 10 is a diagram illustrating an example of a configuration of a power supply apparatus 1A according to a second embodiment of the disclosed techniques. The power supply apparatus 1A is different from the power supply apparatus 1 according to the first embodiment in that the power supply apparatus 1A further includes an over-discharge protection circuit 60. The over-discharge protection circuit 60 has a function of stopping discharge from the power storage circuit 40 when the level of the charging voltage VDD2 of the power storage circuit 40 is lower than a predetermined level.

The over-discharge protection circuit 60 includes a voltage detecting circuit 61 configured to detect the voltage between the positive and negative electrodes of the power storage circuit 40 or the charging voltage VDD2 and includes a P-channel MOSFET 63 (hereinafter referred to as P-MOS 63) that is turned on and off based on an output signal of the voltage detecting circuit 61. The P-MOS 63 has a source coupled to the positive electrode of the power storage circuit 40. The P-MOS 63 has a drain coupled to the source of the P-MOS 303 included in the second switch SW2. The P-MOS 63 has a gate coupled to an output terminal of the voltage detecting circuit 61 via an inverter 62. The voltage detecting circuit 61 may have a configuration of a hysteresis comparator, for example.

When the level of the voltage between the positive and negative electrodes of the power storage circuit 40 or the level of the charging voltage VDD2 is lower than the predetermined level, the voltage detecting circuit 61 outputs a low-level output signal. The low-level output signal output from the voltage detecting circuit 61 is inverted by the inverter 62 to a high-level signal. The high-level signal is supplied to the gate of the P-MOS 63. When the high-level signal is supplied to the gate of the P-MOS 63, the P-MOS 63 is set to an OFF state. By executing this, the discharge from the power storage circuit 40 is stopped.

In the discharging mode, power stored in the power storage circuit 40 is consumed by the load 50, and the level of the charging voltage VDD2 of the power storage circuit 40 is reduced. When the voltage supplied to the load 50 becomes equal to or lower than the minimum operational voltage, the load 50 is stopped operating, but the power storage circuit 40 may continuously discharge electric charges and cause excessive discharge. When the power storage circuit 40 is a secondary battery and excessively discharges electric charges, power storage performance of the power storage circuit 40 may be reduced. In the power supply apparatus 1A according to the second embodiment, when the level of the discharging voltage VDD2 of the power storage circuit 40 is lower than the predetermined level, the over-discharge protection circuit 60 stops the discharge from the power storage circuit 40 and may inhibit the power storage circuit 40 from excessively discharging electric charges. By executing this, the power storage performance may be inhibited from being reduced due to the excessive discharge.

Third Embodiment

Figure 11:
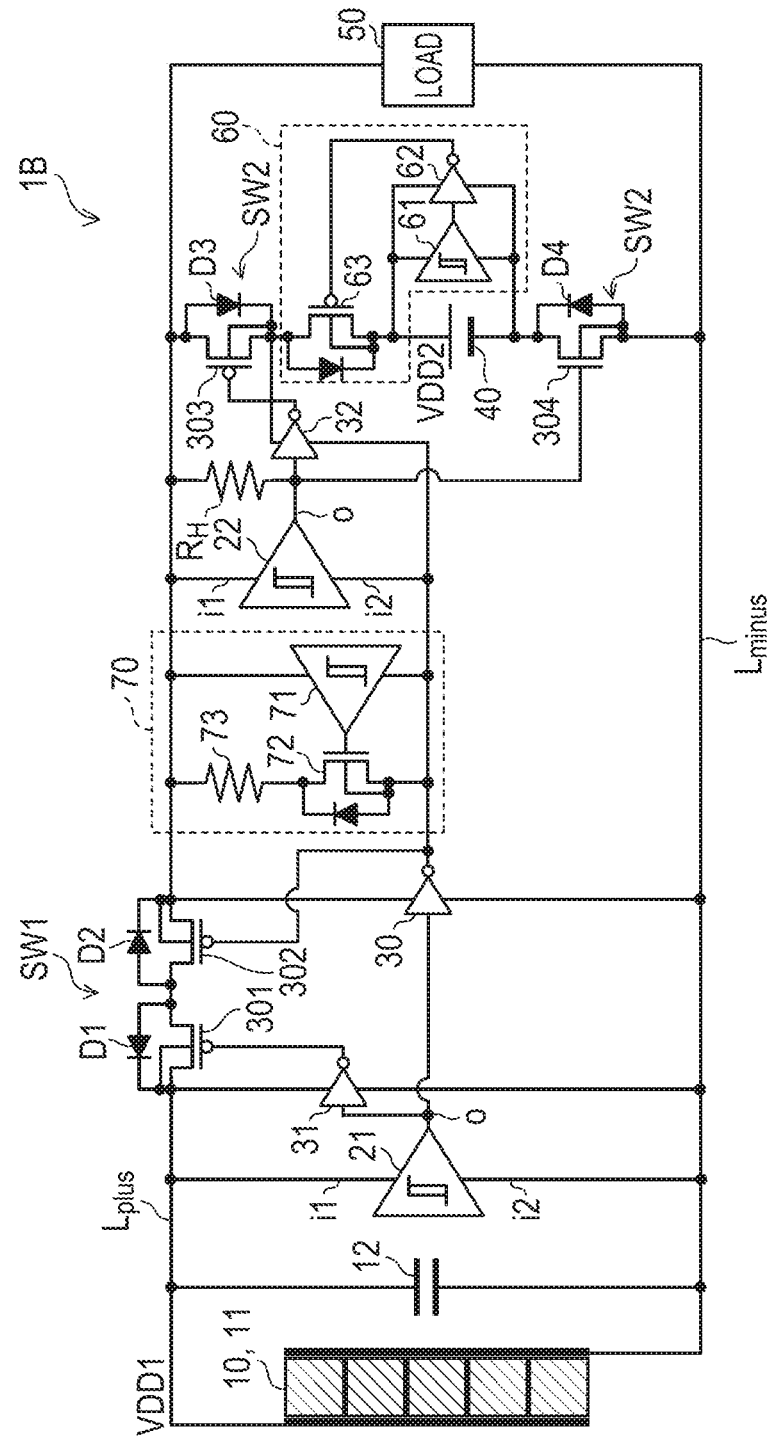
FIG. 11 is a diagram illustrating an example of a configuration of a power supply apparatus according to a third embodiment of the disclosed techniques.

FIG. 11 is a diagram illustrating an example of a configuration of a power supply apparatus 1B according to a third embodiment of the disclosed techniques. The power supply apparatus 1B is different from the power supply apparatus 1A according to the second embodiment in that the power supply apparatus 1B further includes an overcharge protection circuit 70. The overcharge protection circuit 70 has a function of suppressing the amount of power to be transmitted from the solar cell 11 to the power storage circuit 40 when the level of a voltage of the power line $L_{plus}$ is higher than a predetermined level.

The overcharge protection circuit 70 includes a voltage detecting circuit 71 configured to detect a voltage between the power line $L_{plus}$ and the output terminal of the inverter 30, an N-channel MOSFET 72 (hereinafter referred to as N-MOS 72) that is turned on and off based on an output signal of the voltage detecting circuit 71, and a resistance element 73 coupled to the N-MOS 72. One of ends of the resistance element 73 is coupled to the load-side portion of the power line $L_{plus}$, and the other of the ends of the resistance element 73 is coupled to a drain of the N-MOS 72. The N-MOS 72 has a source coupled to the output terminal of the inverter 30 and a gate coupled to an output terminal of the voltage detecting circuit 71. The voltage detecting circuit 71 may have a configuration of a hysteresis comparator, for example.

When the level of the voltage between the power line $L_{plus}$ and the output terminal of the inverter 30 is higher than the predetermined level, the voltage detecting circuit 71 outputs a high-level output signal. The output signal output from the voltage detecting circuit 71 is supplied to the gate of the N-MOS 72. When the high-level signal is supplied to the gate of the N-MOS 72, the N-MOS 72 is set to an ON state. When the N-MOS 72 is set to the ON state, a current flows into the resistance element 73, and power generated by the solar cell 11 is consumed by the resistance element 73.

According to the overcharge protection circuit 70, when the charging voltage VDD2 of the power storage circuit 40 increases and the voltage level of the power line $L_{plus}$ is higher than the predetermined level, the N-MOS 72 is set to the ON state, and power generated by the solar cell 11 is consumed by the resistance element 73. This suppresses the amount of power to be transmitted from the solar cell 11 to the power storage circuit 40 and inhibits the power storage circuit 40 from being excessively charged. Thus, damage to the power storage circuit 40 and the load 50 due to overcharge may be suppressed.

Fourth Embodiment

Figure 12:
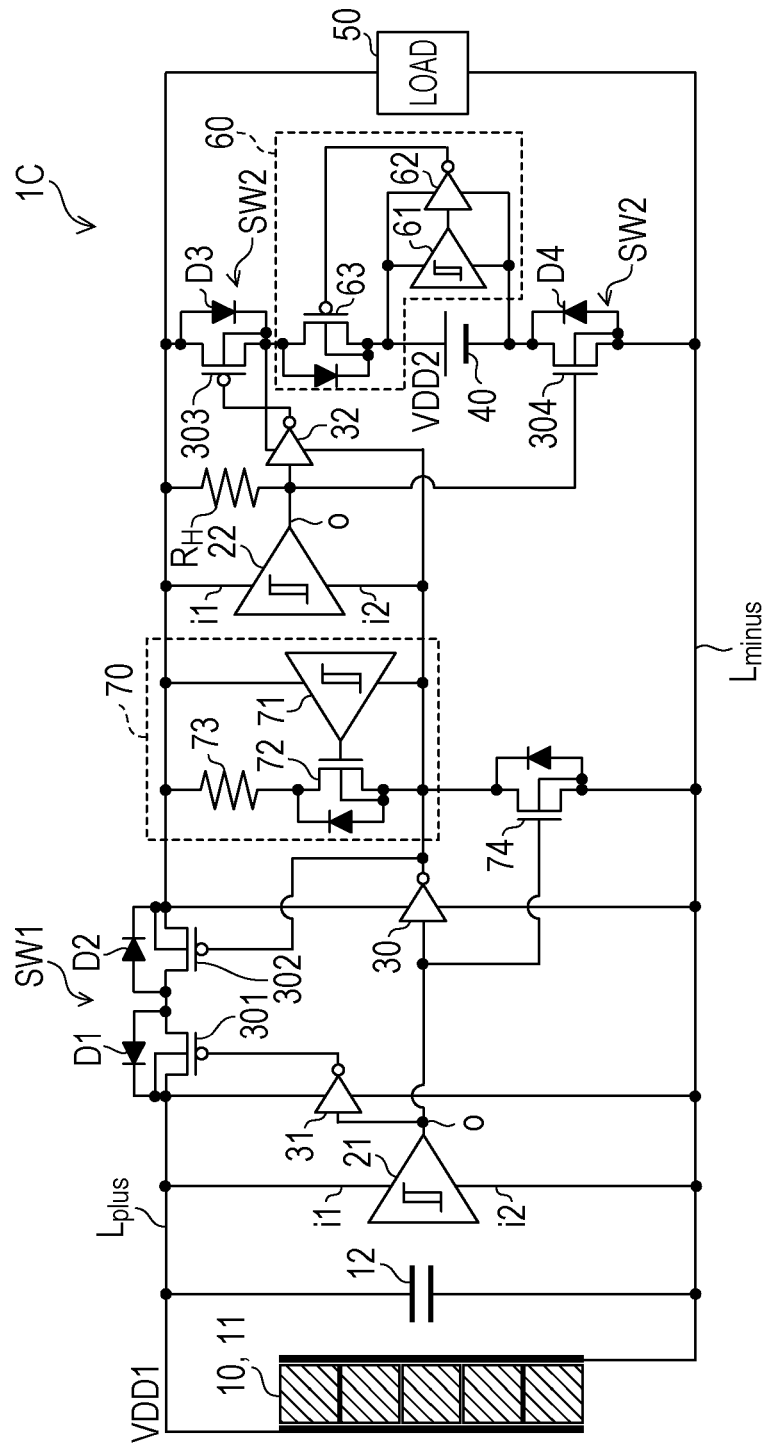
FIG. 12 is a diagram illustrating an example of a configuration of a power supply apparatus according to a fourth embodiment of the disclosed techniques.

FIG. 12 is a diagram illustrating an example of a configuration of a power supply apparatus 1C according to a fourth embodiment of the disclosed techniques. The power supply apparatus 1C is different from the power supply apparatus 1B according to the third embodiment in that the power supply apparatus 1C further includes an N-channel MOSFET 74 (hereinafter referred to as N-MOS 74).

To effectively enable an over-discharge protection function of the over-discharge protection circuit 70, it is requested that a relatively large current flow in the resistance element 73 upon an operation of the over-discharge protection function. In the power supply apparatus 1B according to the third embodiment, a current that has passed through the resistance element 73 flows into the output terminal of the inverter 30. However, it may be difficult to cause a large current to flow into the output terminal of the inverter 30. In the power supply apparatus 1C according to the fourth embodiment, in the charging mode, the N-MOS 74 is in an ON state and the source of the N-MOS 72 is coupled to the power line $L_{minus}$, a large current may flow in the resistance element 73 upon an operation of the over-discharge protection function. Thus, the over-discharge protection function of the over-discharge protection circuit 70 may be effectively enabled.

Fifth Embodiment

Figure 13:
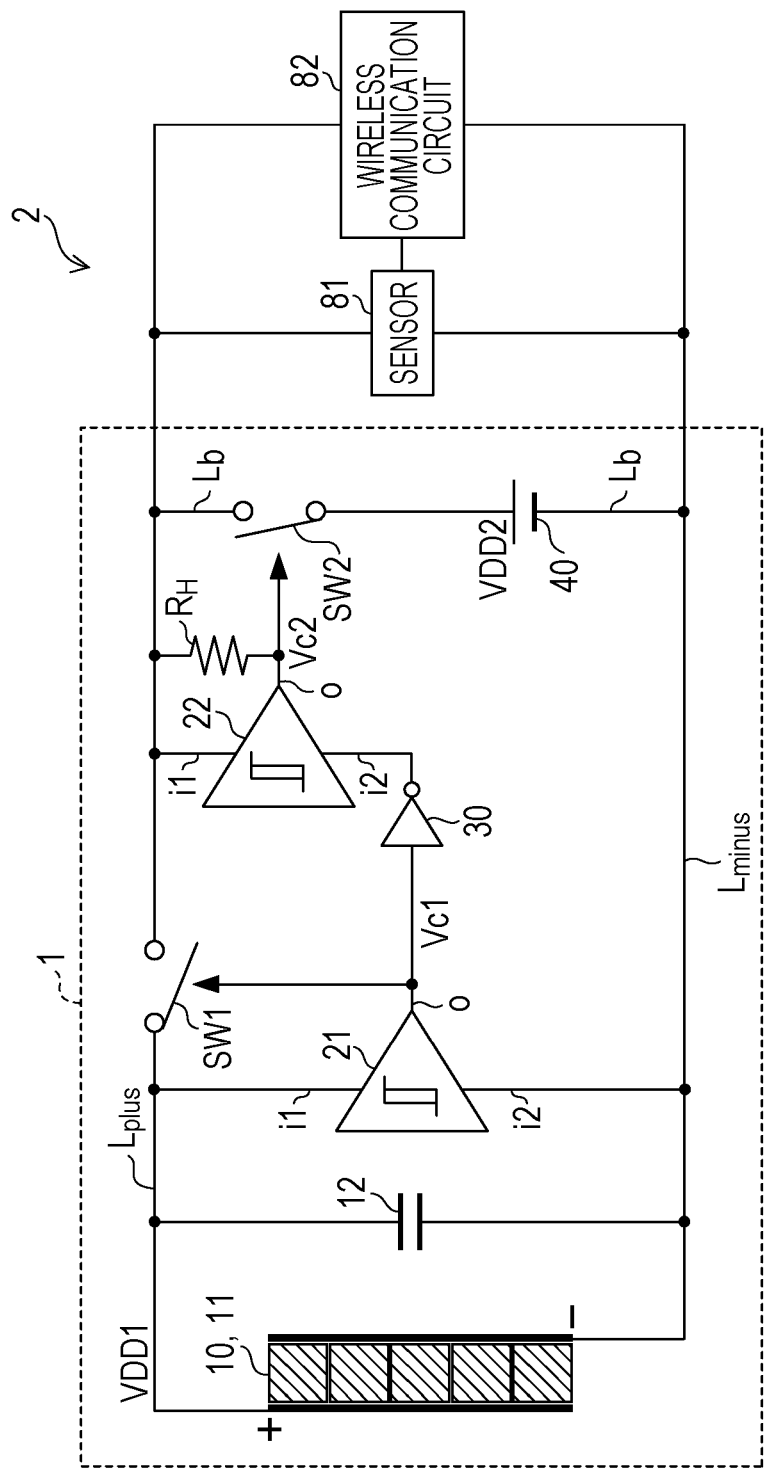
FIG. 13 is a diagram illustrating an example of a configuration of a power supply apparatus according to a fifth embodiment of the disclosed techniques.

FIG. 13 is a diagram illustrating an example of a configuration of a communication apparatus 2 according to a fifth embodiment of the disclosed techniques. The communication apparatus 2 includes the power supply apparatus 1, a sensor 81, and a wireless communication circuit 82. The sensor 81 and the wireless communication circuit 82 receive power supplied from the power supply apparatus 1 and operate. Specifically, the sensor 81 and the wireless communication circuit 82 correspond to the load 50 illustrated in FIG. 1 and the other drawings. When the power supply apparatus 1 is in the charging mode, the sensor 81 and the wireless communication circuit 82 are driven by power generated by the solar cell 11. When the power supply apparatus 1 is in the discharging mode, the sensor 81 and the wireless communication circuit 82 are driven by power stored in the power storage circuit 40.

As the sensor 81, any of various sensors such as a temperature sensor, a humidity sensor, an illuminance sensor, or a voltage sensor may be used. The wireless communication circuit 82 has a function of transmitting data acquired by the sensor 81 to an external device via wireless communication. The communication apparatus 2 may form a senor node in a sensor network. The communication apparatus 2 may include any of the power supply apparatus 1A, 1B, and 1C, instead of the power supply apparatus 1.

The power supply apparatus 1, 1A, 1B, and 1C are examples of a power supply apparatus according to the disclosed techniques. The communication apparatus 2 is an example of a communication apparatus according to the disclosed techniques. The power generating circuit 10 and the solar cell 11 are examples of a power generating circuit according to the disclosed techniques. The power lines $L_{plus}$ and $L_{minus}$ are an example of a pair of power lines according to the disclosed techniques. The first switch SW1 is an example of a first switch according to the disclosed techniques. The first switch control circuit 21 is an example of a first switch control circuit according to the disclosed techniques. The second switch SW2 is an example of a second switch according to the disclosed techniques. The second switch control circuit 22 is an example of a second switch control circuit according to the disclosed techniques. The branched line $L_b$ is an example of a branched line according to the disclosed techniques. The power storage circuit 40 is an example of a power storage circuit according to the disclosed techniques. The P-MOSs 301, 313, and 315 and the N-MOS 317 are examples of a first transistor according to the disclosed techniques. The parasitic diodes D1, D13, D15, and D17 are examples of a first diode according to the disclosed techniques. The P-MOSs 302 and 314 and the N-MOS 316 and 318 are examples of a second transistor according to the disclosed techniques. The parasitic diodes D2, D14, D16, and D18 are examples of a second diode according to the disclosed techniques. The P-MOSs 303, 305, and 307 and the N-MOSs 309 and 311 are examples of a third transistor according to the disclosed techniques. The parasitic diodes D3, D5, D7, D9, and D11 are examples of a third diode according to the disclosed techniques. The N-MOSs 304, 306, 308, 310, and 312 are examples of a fourth transistor according to the disclosed techniques. The parasitic diodes D4, D6, D8, D10, and D12 are examples of a fourth diode according to the disclosed techniques. The over-discharge protection circuit 60 is an example of an over-discharge protection circuit according to the disclosed techniques. The overcharge protection circuit 70 is an example of an overcharge protection circuit according to the disclosed techniques. The wireless communication circuit 82 is an example of a wireless communication circuit according to the disclosed techniques.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A power supply apparatus comprising:
   a power generating circuit configured to convert energy to power and output a voltage of the power;
   a first switch installed on either or both of a pair of power lines to which the voltage of the power is applied and to which a load is to be coupled;
   a capacitor coupled to the pair of power lines in parallel to the power generating circuit;
   a first switch control circuit configured to control the first switch based on a level of a voltage generated between the pair of power lines;
   a second switch installed on a branched line coupled to the pair of power lines at an opposite side of the first switch to the power generating circuit;
   a power storage circuit, having a capacity larger than the capacity of the capacitor, and being installed on the branched line in series to the second switch;
   a second switch control circuit configured to:
      control the second switch based on the level of the voltage generated between the pair of power lines when the first switch is set to ON state, and
      the power storage circuit is coupled to the power generating circuit when the first switch and the second switch are set to ON states,
   wherein the first switch control circuit outputs a control voltage to control the first switch to the ON state when the level of the voltage generated between the pair of power lines is higher than a first threshold, and the first switch control circuit outputs a control voltage to control the first switch to an OFF state when the level of the voltage generated between the pair of power lines is lower than a second threshold that is lower than the first threshold,
   wherein, when the load is coupled to the pair of power lines and when the first switch is set to ON state, the second switch control circuit outputs a control voltage to control the second switch to the ON state when the level of the voltage generated between the pair of power lines is higher than a third threshold, whereby the power storage circuit is charged with power generated by the power generating circuit, and the second switch control circuit outputs a control voltage to control the second switch to an OFF state when the level of the voltage generated between the pair of power lines is lower than a fourth threshold that is lower than the third threshold, and
   wherein the third threshold is higher than the first threshold and the fourth threshold is higher than the second threshold.

2. The power supply apparatus according to claim 1, wherein the second switch control circuit outputs the control voltage to control the second switch to the ON state based on a control voltage output from the first switch control circuit and causing the first switch to be set to the OFF state.

3. The power supply apparatus according to claim 1, wherein
   the first switch includes:
      a first transistor installed on either or both of the pair of power lines and coupled to a first diode between a drain and source of the first transistor, and
      a second transistor coupled to a second diode between a drain and a source of the second transistor and installed on either or both of the pair of power lines so that the orientation of the second diode is opposite to the orientation of the first diode; and
   the second switch includes:
      a third transistor installed on the branched line and coupled to a third diode between a drain and source of the third transistor, and
      a fourth transistor coupled to a fourth diode between a drain and source of the fourth transistor and installed on the branched line so that the orientation of the fourth diode is opposite to the orientation of the third diode.

4. The power supply apparatus according to claim 1, further comprising:
   an over-discharge protection circuit configured to stop discharge from the power storage circuit when the level of a charging voltage of the power storage circuit is lower than a predetermined level.

5. The power supply apparatus according to claim 1, further comprising:
   an overcharge protection circuit configured to suppress the amount of power to be transmitted from the power generating circuit to the power storage circuit when the level of the voltage generated between the pair of power lines is higher than a predetermined level.

6. The power supply apparatus according to claim 1, wherein the power generating circuit is a solar cell.

7. A communication apparatus comprising:
   a power generating circuit configured to convert energy to power and output a voltage of the power;
   a capacitor coupled to the pair of power lines in parallel to the power generating circuit;
   a first switch installed on either or both of a pair of power lines to which the voltage of the power is applied;
   a first switch control circuit configured to control the first switch based on a level of a voltage generated between the pair of power lines;
   a second switch installed on a branched line coupled to the pair of power lines at an opposite side of the first switch to the power generating circuit;

a power storage circuit, having a capacity larger than the capacity of the capacitor, and being installed on the branched line in series to the second switch;
a second switch control circuit configured to:
   control the second switch based on the level of the voltage generated between the pair of power lines when the first switch is set to ON state, and
the power storage circuit is coupled to the power generating circuit when the first switch and the second switch are set to ON states; and
a wireless communication circuit coupled in parallel to the branched line and to the power generating circuit when the first switch is set to the ON state, and coupled to the power storage circuit when the second switch is set to the ON state,
wherein the first switch control circuit outputs a control voltage to control the first switch to the ON state when the level of the voltage generated between the pair of power lines is higher than a first threshold, and the first switch control circuit outputs a control voltage to control the first switch to an OFF state when the level of the voltage generated between the pair of power lines is lower than a second threshold that is lower than the first threshold,
wherein, when the first switch is set to ON state, the second switch control circuit outputs a control voltage to control the second switch to the ON state when the level of the voltage generated between the pair of power lines is higher than a third threshold, whereby the power storage circuit is charged with power generated by power generating circuit, and the second switch control circuit outputs a control voltage to control the second switch to an OFF state when the level of the voltage generated between the pair of power lines is lower than a fourth threshold that is lower than the third threshold, and
wherein the third threshold is higher than the first threshold and the fourth threshold is higher than the second threshold.

8. The communication apparatus according to claim 7, further comprising:
a sensor configured coupled to the power storage circuit when the second switch is set to an ON state,
wherein the wireless communication circuit wirelessly transmits data acquired by the sensor to an external device.

9. The communication apparatus according to claim 8, wherein the second switch control circuit outputs the control voltage to control the second switch to the ON state based on a control voltage output from the first switch control circuit and causing the first switch to be set to the OFF state.

10. The communication apparatus according to claim 8, wherein
the first switch includes:
   a first transistor installed on either or both of the pair of power lines and coupled to a first diode between a drain and source of the first transistor, and
   a second transistor coupled to a second diode between a drain and a source of the second transistor and installed on either or both of the pair of power lines so that the orientation of the second diode is opposite to the orientation of the first diode; and
the second switch includes:
   a third transistor installed on the branched line and coupled to a third diode between a drain and source of the third transistor, and
   a fourth transistor coupled to a fourth diode between a drain and source of the fourth transistor and installed on the branched line so that the orientation of the fourth diode is opposite to the orientation of the third diode.

11. The communication apparatus according to claim 8, further comprising:
an over-discharge protection circuit configured to stop discharge from the power storage circuit when the level of a charging voltage of the power storage circuit is lower than a predetermined level.

12. The communication apparatus according to claim 8, further comprising:
an overcharge protection circuit configured to suppress the amount of power to be transmitted from the power generating circuit to the power storage circuit when the level of the voltage generated between the pair of power lines is higher than a predetermined level.

13. The communication apparatus according to claim 8, wherein the power generating circuit is a solar cell.

* * * * *